United States Patent
Namai et al.

(10) Patent No.: US 9,412,593 B2
(45) Date of Patent: Aug. 9, 2016

(54) COMPOSITION FOR FILM FORMATION, RESIST UNDERLAYER FILM, AND FORMING METHOD OF RESIST UNDERLAYER FILM, AND PATTERN-FORMING METHOD

(71) Applicant: JSR CORPORATION, Tokyo (JP)

(72) Inventors: Hayato Namai, Tokyo (JP); Goji Wakamatsu, Tokyo (JP)

(73) Assignee: JSR CORPORATION, Tokyo (JP)

(*) Notice: Subject to any disclaimer, the term of this patent is extended or adjusted under 35 U.S.C. 154(b) by 0 days.

(21) Appl. No.: 14/662,642

(22) Filed: Mar. 19, 2015

(65) Prior Publication Data

US 2015/0267046 A1    Sep. 24, 2015

(30) Foreign Application Priority Data

Mar. 20, 2014 (JP) .................. 2014-059096

(51) Int. Cl.
| | |
|---|---|
| *H01L 21/027* | (2006.01) |
| *H01L 21/033* | (2006.01) |
| *C08L 47/00* | (2006.01) |
| *G03F 7/09* | (2006.01) |
| *G03F 7/20* | (2006.01) |
| *H01L 21/02* | (2006.01) |
| *H01L 21/311* | (2006.01) |
| *B05D 3/02* | (2006.01) |
| *C08F 12/32* | (2006.01) |
| *C08F 12/34* | (2006.01) |
| *C09D 125/16* | (2006.01) |

(52) U.S. Cl.
CPC .......... *H01L 21/0332* (2013.01); *B05D 3/0254* (2013.01); *C08F 12/32* (2013.01); *C08F 12/34* (2013.01); *C08L 47/00* (2013.01); *C09D 125/16* (2013.01); *G03F 7/09* (2013.01); *G03F 7/091* (2013.01); *G03F 7/094* (2013.01); *G03F 7/20* (2013.01); *H01L 21/0271* (2013.01); *H01L 21/0276* (2013.01); *H01L 21/02118* (2013.01); *H01L 21/31144* (2013.01)

(58) Field of Classification Search
None
See application file for complete search history.

(56) References Cited

FOREIGN PATENT DOCUMENTS

| | | | |
|---|---|---|---|
| JP | 2002-296789 A | 10/2002 | |
| JP | 2004-168748 A | 6/2004 | |
| JP | 2004-177668 A | 6/2004 | |
| WO | WO2014172020 | * 10/2014 | ............. G01N 33/22 |

* cited by examiner

*Primary Examiner* — Jiong-Ping Lu

(74) *Attorney, Agent, or Firm* — Oblon, McClelland, Maier & Neustadt, L.L.P.

(57) ABSTRACT

A composition for film formation includes a compound represented by formula (1), and a solvent. $R^1$ represents a monovalent group including an aromatic ring. n is an integer of 3 to 6. At least one monovalent group represented by $R^1$ further includes a group including an ethylenic double bond. a plurality of $R^1$s are identical or different. A part or all of hydrogen atoms on the benzene ring in the formula (1) and on the aromatic ring are unsubstituted or substituted with a halogen atom or an alkyl group having 1 to 10 carbon atoms.

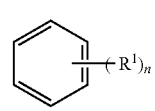

(1)

17 Claims, No Drawings

COMPOSITION FOR FILM FORMATION, RESIST UNDERLAYER FILM, AND FORMING METHOD OF RESIST UNDERLAYER FILM, AND PATTERN-FORMING METHOD

CROSS-REFERENCE TO RELATED APPLICATIONS

The present application claims priority to Japanese Patent Application No. 2014-059096, filed Mar. 20, 2014. The contents of this application are incorporated herein by reference in their entirety.

BACKGROUND OF THE INVENTION

1. Field of the Invention

The present invention relates to a composition for film formation, a resist underlayer film, a forming method of a resist underlayer film, and a pattern-forming method.

2. Discussion of the Background

In manufacturing semiconductor devices and the like, multilayer resist processes have been employed for attaining a high degree of integration. In these processes, generally, a composition for forming a resist underlayer film is first coated on the upper face side of a substrate to form a resist underlayer film, and then a resist pattern is formed on the upper face side of the resist underlayer film. Subsequently, the resist pattern is transferred to the resist underlayer film through etching, and the resist underlayer film pattern is then transferred to the substrate, thereby enabling a desired pattern to be obtained. Resist underlayer films used in such multilayer resist processes are required to exhibit general characteristics such as optical characteristics, e.g., appropriate refractive index and extinction coefficient, as well as favorable etching resistance.

In recent years, microfabrication of patterns has been further in progress in order to further increase the degree of integration. To meet such microfabrication, structures, functional groups, etc., of compounds and the like contained in the composition for forming a resist underlayer film have been variously investigated (see Japanese Unexamined Patent Application, Publication No. 2004-177668).

Recently, methods which include providing a hard mask on a resist underlayer film using CVD techniques in the multilayer resist processes have been investigated. Specifically, in these processes, an inorganic hard mask as an intermediate layer is formed on the resist underlayer film using a CVD technique. In a case where the inorganic hard mask, particularly an inorganic nitride hard mask, is formed by using the CVD technique, a substrate needs to be heated to a temperature of at least 300° C., and typically 400° C.

Moreover, in these days, formation of a pattern on a substrate having a plurality of types of trenches, in particular, trenches differing from one another in terms of an aspect ratio has been executed more frequently. Even in the case where such a substrate is employed, the resist underlayer film is required to be formed such that these trenches are sufficiently buried, with superior flatness.

SUMMARY OF THE INVENTION

According to one aspect of the present invention, a composition for film formation includes a compound represented by formula (1), and a solvent. $R^1$ represents a monovalent group including an aromatic ring (hereinafter, may be also referred to as "aromatic ring-containing monovalent group"). n is an integer of 3 to 6. At least one monovalent group represented by $R^1$ further includes a group including an ethylenic double bond (hereinafter, may be also referred to as "ethylenic double bond-containing group"). a plurality of $R^1$s are identical or different. A part or all of hydrogen atoms on the benzene ring in the formula (1) and on the aromatic ring are unsubstituted or substituted with a halogen atom or an alkyl group having 1 to 10 carbon atoms.

According to another aspect of the present invention, a resist underlayer film is formed by using the composition.

According to further aspect of the present invention, a forming method of a resist underlayer film includes providing a coating film directly or indirectly on a substrate by using the composition, and baking the coating film.

According to further aspect of the present invention, a pattern-forming method includes providing a coating film directly or indirectly on a substrate by using the composition. The coating film is baked such that a resist underlayer film is formed. A resist pattern is formed on the resist underlayer film. The resist underlayer film and the substrate are sequentially etched using the resist pattern as a mask.

DESCRIPTION OF THE EMBODIMENTS

According to an embodiment of the invention, a composition for film formation contains: a compound represented by the following formula (1) (hereinafter, may be also referred to as "(A) compound" or "compound (A)"); and a solvent (hereinafter, may be also referred to as "(B) solvent" or "solvent (B)"),

wherein in the formula (1), $R^1$ represents an aromatic ring-containing monovalent group; and n is an integer of 3 to 6, wherein at least one of a plurality of $R^1$s further include an ethylenic double bond-containing group, and the plurality of $R^1$s are identical or different, and wherein a part or all of hydrogen atoms on the benzene ring in the above formula (1) and on the aromatic ring are unsubstituted or substituted with a halogen atom or an alkyl group having 1 to 10 carbon atoms.

According to another embodiment of the invention, a resist underlayer film is formed by using the composition for film formation.

According to still another embodiment of the invention, a forming method of a resist underlayer film includes: providing a coating film directly or indirectly on a substrate; and baking the coating film, wherein the coating film is provided by using the composition for film formation.

According to yet still another embodiment of the, a pattern-forming method includes: forming a resist pattern on a resist underlayer film formed by the forming method of the resist underlayer film; and sequentially etching the resist underlayer film and the substrate using the resist pattern as a mask.

According to the composition for film formation and the forming method of a resist underlayer film of the embodiments of the present invention, formation of a resist underlayer film is enabled that satisfies requirements for general characteristics such as optical characteristics and etching resistance, and that exhibits superior heat resistance and superior flatness. Specifically, if the heat resistance is not sufficient, a resist underlayer film component may be sublimated by heat in forming the resist underlayer film and the sublimated component may adhere to the substrate again, thereby leading to a decrease of yields of the production of semiconductor devices. According to the embodiments of the present invention, such disadvantage can be reduced. According to the pattern-forming method of the embodiment of the present invention, a favorable pattern can be formed since the resist underlayer film having superior heat resistance and superior flatness is used. Therefore, these embodiments may be suitably used in pattern formation that employ a multilayer resist process in manufacture of semiconductor devices in which microfabrication of patterns has been further in progress.

Hereinafter, embodiments of the present invention will be explained in detail.

Composition for Film Formation

The composition for film formation contains (A) a compound and (B) a solvent. The composition for film formation may contain an acid generating agent (hereinafter, may be also referred to as "(C) acid generating agent" or "acid generating agent (C)"), and a crosslinking agent (hereinafter, may be also referred to as "(D) crosslinking agent" or "crosslinking agent (D)") as a favorable component, and may contain other optional component within a range not leading to impairment of the effects of the present invention.

Due to containing the compound (A) and the solvent (B), the composition for film formation enables a resist underlayer film to be formed that satisfies requirements for general characteristics such as optical characteristics and etching resistance, and that exhibits superior heat resistance and superior flatness. In other words, the composition for film formation can be particularly suitably used for forming a resist underlayer film.

Although not necessarily clarified, the reason for achieving the above-described effects due to the composition for film formation having the constitution is presumed as in the following, for example. As represented by the above formula (1), the compound (A) contained in the composition for film formation has a skeleton including a central benzene ring to which 3 to 6 monovalent groups that includes an aromatic ring bond, and at least one of the monovalent groups includes an ethylenic double bond-containing group (hereinafter, may be also referred to as "group (a)"). Due to the compound (A) having such a structure, the formed resist underlayer film can satisfy requirements for general characteristics such as optical characteristics and etching resistance. In addition, the compound (A) can have improved stability, and as a result, the resist underlayer film can achieve superior heat resistance. Moreover, it is possible to adjust the molecular size of the compound (A) adequately, and to give either single molecular size or a molecular size distribution falling within an extremely narrow range. Consequently, the resist underlayer film can exhibit superior flatness.

Hereinafter, each component is explained.

(A) Compound

The compound (A) is represented by the following formula (1).

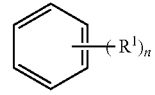

(1)

In the above formula (1), $R^1$ represents an aromatic ring-containing monovalent group; and n is an integer of 3 to 6, wherein at least one of a plurality of $R^1$s further includes an ethylenic double bond-containing group, and the plurality of $R^1$s are identical or different, and wherein a part or all of hydrogen atoms on the benzene ring in the above formula (1) and on the aromatic ring are unsubstituted or substituted with a halogen atom or an alkyl group having 1 to 10 carbon atoms.

According to the compound (A), due to at least one of a plurality of $R^1$s further including the ethylenic double bond-containing group in addition to the aromatic ring, the strength of the formed resist underlayer film is increased owing to crosslinking between the compounds (A), between the compound (A) and the crosslinking agent (D) described later, or the like, and consequently the heat resistance of the formed resist underlayer film, and the like becomes superior.

The aromatic ring included in $R^1$ is exemplified by a benzene ring, a naphthalene ring, an anthracene ring, and the like. Of these, a benzene ring and a naphthalene ring are preferred.

The halogen atom which may substitute the hydrogen atom(s) on the benzene ring in the above formula (1) and on the aromatic ring is exemplified by a fluorine atom, a chlorine atom, a bromine atom, an iodine atom, and the like. Of these, a fluorine atom and a chlorine atom are preferred, and a fluorine atom is more preferred.

The alkyl group having 1 to 10 carbon atoms which may substitute the hydrogen atom(s) on the benzene ring in the above formula (1) and on the aromatic ring is exemplified by a methyl group, an ethyl group, a n-propyl group, an i-propyl group, a n-butyl group, an i-butyl group, a sec-butyl group, a t-butyl group, a n-pentyl group, a n-hexyl group, and the like. Of these, an alkyl group having 1 to 4 carbon atoms is preferred, a methyl group and an ethyl group are more preferred, and a methyl group is still more preferred.

At least one of the plurality of $R^1$s further includes an ethylenic double bond-containing group, in addition to the aromatic ring. The ethylenic double bond-containing group is exemplified by monovalent groups such as a vinyl group, an allyl group and a (meth)acryloyl group, as well as groups having a valency of 2 to 4 which may be obtained by eliminating 1 to 3 hydrogen atom(s) from these monovalent groups, and the like.

$R^1$ may include a crosslinkable group other than the ethylenic double bond-containing group. "Crosslinkable group" as referred to means a group that enables a covalent bond to be formed within a single molecule or between different molecules.

Examples of the other crosslinkable group include:
monovalent groups including for example,
epoxy groups such as an oxiranyl group and an oxetanyl group:
alkoxymethyl groups such as a methoxymethyl group and an ethoxymethyl group:
hydroxy-containing groups such as a hydroxymethyl group and a hydroxyphenyl group;

acyl groups such as a formyl group and an acetyl group;

substituted aminomethyl groups such as a dialkylaminomethyl group and a dimethylolaminomethyl group; and the like.

$R^1$ is preferably a group represented by the following formula (a).

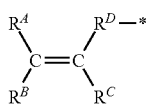
(a)

In the above formula (a), $R^A$, $R^B$ and $R^C$ each independently represent a hydrogen atom, a monovalent chain hydrocarbon group having 1 to 10 carbon atoms or a monovalent aromatic hydrocarbon group having 6 to 30 carbon atoms; $R^D$ represents a single bond or a divalent aromatic hydrocarbon group having 6 to 30 carbon atoms, wherein at least one of $R^A$ to $R^D$ includes the aromatic ring, wherein a part or all of hydrogen atoms on the aromatic ring are unsubstituted or substituted with a halogen atom or an alkyl group having 1 to 10 carbon atoms, and wherein * denotes a biding site with respect to a carbon atom of the benzene ring in the above formula (1).

Examples of the chain hydrocarbon group having 1 to 10 carbon atoms which may be represented by $R^A$, $R^B$ and $R^C$ include:

alkyl groups such as a methyl group, an ethyl group, a n-propyl group, an i-propyl group, a n-butyl group, an i-butyl group, a sec-butyl group, a t-butyl group, a n-pentyl group and a n-hexyl group;

alkenyl groups such as an ethenyl group, a propenyl group and a butenyl group;

alkynyl groups such as an ethynyl group, a propynyl group and a butynyl group; and the like.

Examples of the monovalent aromatic hydrocarbon group having 6 to 30 carbon atoms which may be represented by $R^A$, $R^B$ and $R^C$ include:

aryl groups such as a phenyl group, a biphenyl group, a tolyl group, a naphthyl group and an anthryl group;

aralkyl groups such as a benzyl group, a phenethyl group and a naphthylmethyl group; and the like.

As $R^A$ and $R^B$, a hydrogen atom and an alkyl group are preferred, and a hydrogen atom is more preferred in light of an improvement of the heat resistance of the formed resist underlayer film.

As $R^C$, a methyl group, a phenyl group, a biphenyl group and a naphthyl group are preferred in light of an improvement of the heat resistance of the formed resist underlayer film.

Examples of the divalent aromatic hydrocarbon group having 6 to 30 carbon atoms which may be represented by $R^D$ include:

arylene groups such as a phenylene group, a naphthylene group, a biphenylene group and an anthrylene group;

arylenealkylene groups such as a benzylene group, a phenyleneethylene group, a naphthylenemethylene group and a naphthyleneethylene group; and the like.

As $R^D$, a single bond, a phenylene group, a biphenylene group and a naphthylene group are preferred in light of an improvement of the heat resistance of the formed resist underlayer film.

The halogen atom which may substitute the hydrogen atom(s) on the aromatic ring included in $R^A$ to $R^D$ is exemplified by atoms similar to the halogen atom which may substitute the hydrogen atom(s) on the benzene ring and the aromatic ring included in the compound represented by the above formula (1), and the like.

The alkyl group having 1 to 10 carbon atoms which may substitute the hydrogen atom(s) on the aromatic ring included in $R^A$ to $R^D$ is exemplified by the alkyl group having 1 to 10 carbon atoms which may substitute the hydrogen atom(s) on the benzene ring and the aromatic ring included in the compound represented by the above formula (1), and the like.

The compound (A) is preferably a compound represented by the following formula (1-1) or a compound represented by the following formula (1-2). The benzene ring and the aromatic ring in the following formula (1-1), and the benzene ring and the ethylenic double bond-containing group in the following formula (1-2) constitute the central skeleton of the compound (A). Due to having such a structure, it is possible to adjust the molecular size of the compound (A) adequately, and to give either single molecular size or a molecular size distribution falling within an extremely narrow range. Consequently, the resist underlayer film can exhibit more superior flatness.

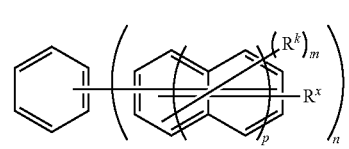
(1-1)

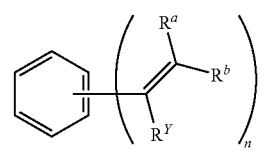
(1-2)

In the above formulae (1-1) and (1-2), n is as defined in the above formula (1), and a part or all of hydrogen atoms on the benzene ring in the above formulae (1-1) and (1-2) are unsubstituted or substituted with a halogen atom or an alkyl group having 1 to 10 carbon atoms.

In the above formula (1-1), $R^X$ represents a monovalent group that includes the ethylenic double bond-containing group; $R^k$ represents a halogen atom or an alkyl group having 1 to 10 carbon atoms; p is an integer of 0 to 2, wherein a plurality of $R^X$s are identical or different, and a plurality of "p"s are identical or different; and m is an integer of 0 to 8, wherein in a case where $R^k$ is present in a plurality of number, a plurality of $R^k$s are identical or different.

In the above formula (1-2), $R^Y$ represents the aromatic ring-containing monovalent group; and $R^a$ and $R^b$ each independently represent a hydrogen atom or a monovalent chain hydrocarbon group having 1 to 10 carbon atoms, wherein a plurality of $R^Y$s are identical or different, a plurality of $R^a$s are identical or different, and a plurality of $R^b$s are identical or different.

Examples of the monovalent group that includes an ethylenic double bond-containing group which is represented by $R^X$ include: ethylenic double bond-containing groups; groups obtained by combining an ethylenic double bond-containing group with an aromatic ring-containing group; and the like.

The halogen atom which may be represented by $R^k$ is exemplified by a fluorine atom, a chlorine atom, a bromine atom, an iodine atom, and the like.

The alkyl group having 1 to 10 carbon atoms which may be represented by $R^k$ is exemplified by alkyl groups similar to those exemplified in connection with $R^A$, $R^B$ and $R^C$, and the like.

Examples of the monovalent group that includes an aromatic ring which is represented by $R^Y$ include: aromatic ring-containing groups; groups obtained by combining a double bond-containing group with an aromatic ring-containing group; and the like.

The monovalent chain hydrocarbon group having 1 to 10 carbon atoms which may be represented by $R^a$ and $R^b$ is exemplified by groups similar to those exemplified in connection with $R^A$, $R^B$ and $R^C$, and the like.

$R^a$ and $R^b$ are preferably a hydrogen atom.

Preferably, p is 0 or 1.

Preferably, m is 0 or 1, and more preferably 0.

Moreover, the compound (A) is preferably: a compound represented by the following formula (1-a) in which three identical $R^1$s bond to a central benzene ring at 1,3,5-positions of the central benzene ring, respectively; a compound represented by the following formula (1-b) in which four identical $R^1$s bond to a central benzene ring at 1,2,4,5-positions of the central benzene ring, respectively; or a compound represented by the following formula (1-c) in which identical $R^1$s bond to a central benzene ring at six carbon atoms of the central benzene ring, respectively, in light of a further improvement of the flatness of the formed resist underlayer film, and a further improvement of the ease in synthesis of the compound (A).

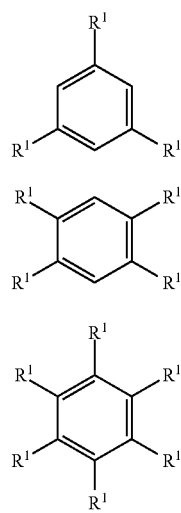

In the above formulae (1-a) to (1-c), $R^1$ is as defined in the above formula (1).

Examples of the compound (1-a) include compounds represented by the following formulae (1-a-1) to (1-a-6) (hereinafter, may be also referred to as "compounds (1-a-1) to (1-a-6)"), and the like.

Examples of the compound (1-b) include compounds represented by the following formulae (1-b-1) to (1-b-3) (hereinafter, may be also referred to as "compounds (1-b-1) to (1-b-3)"), and the like.

Examples of the compound (1-c) include compounds represented by the following formulae (1-c-1) to (1-c-3) (hereinafter, may be also referred to as "compounds (1-c-1) to (1-c-3)"), and the like.

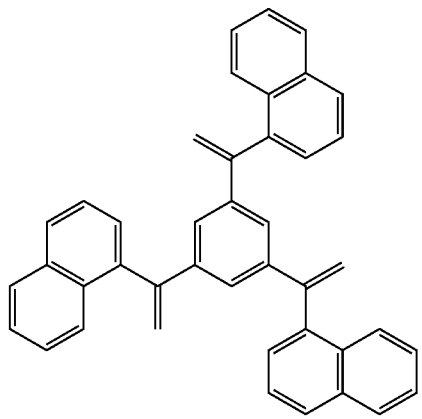

(1-a-1)

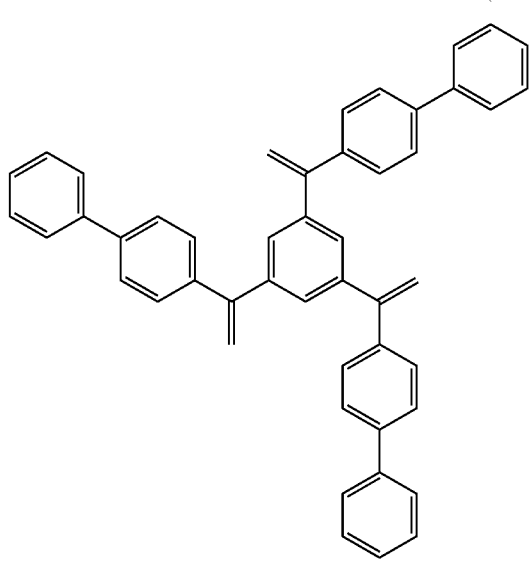

(1-a-2)

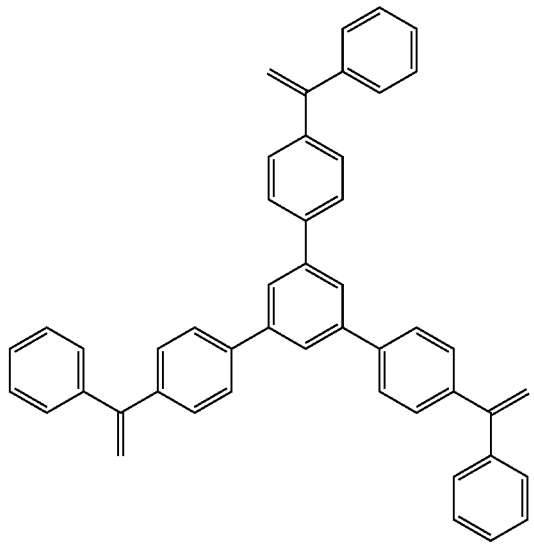

(1-a-3)

-continued
(1-a-4)
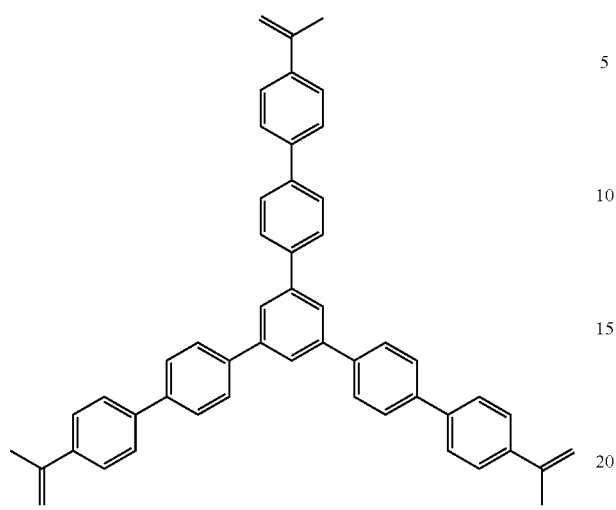
(1-b-1)
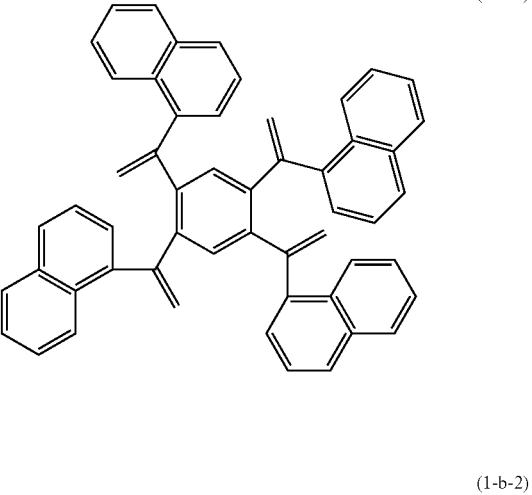
(1-a-5)
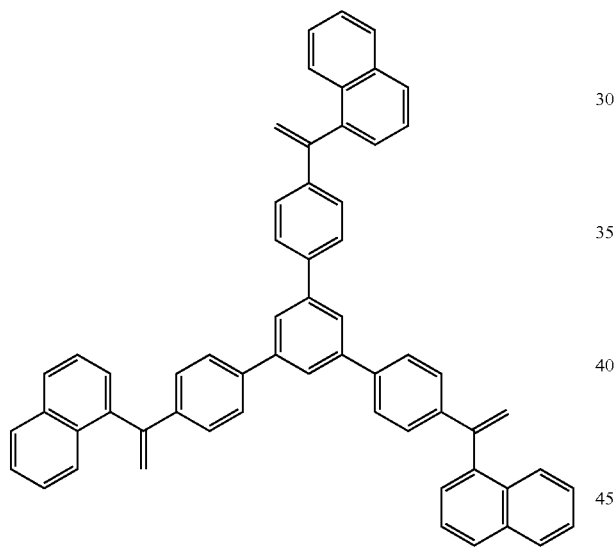
(1-b-2)
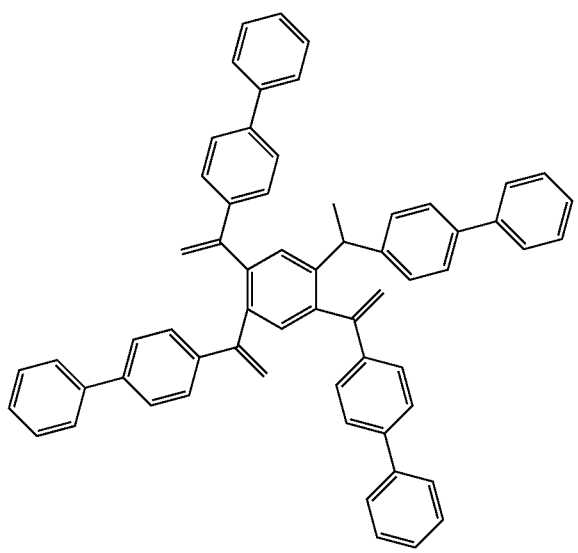
(1-a-6)
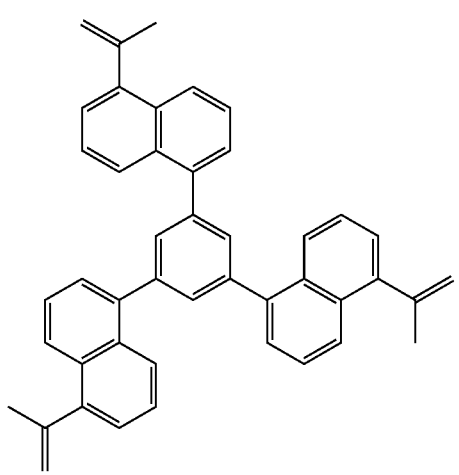
(1-b-3)
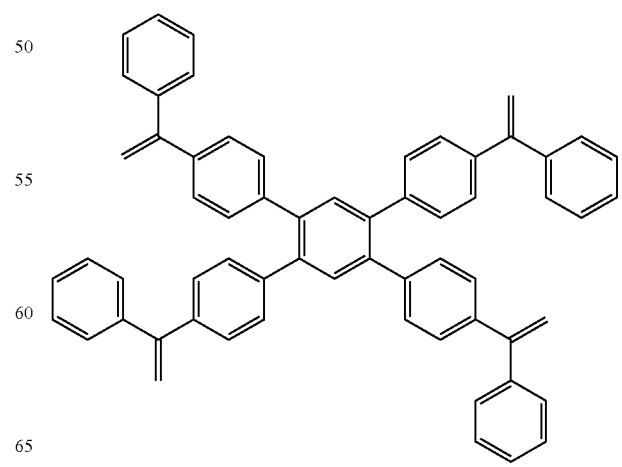

-continued (1-c-1)

(1-c-2)

(1-c-3)

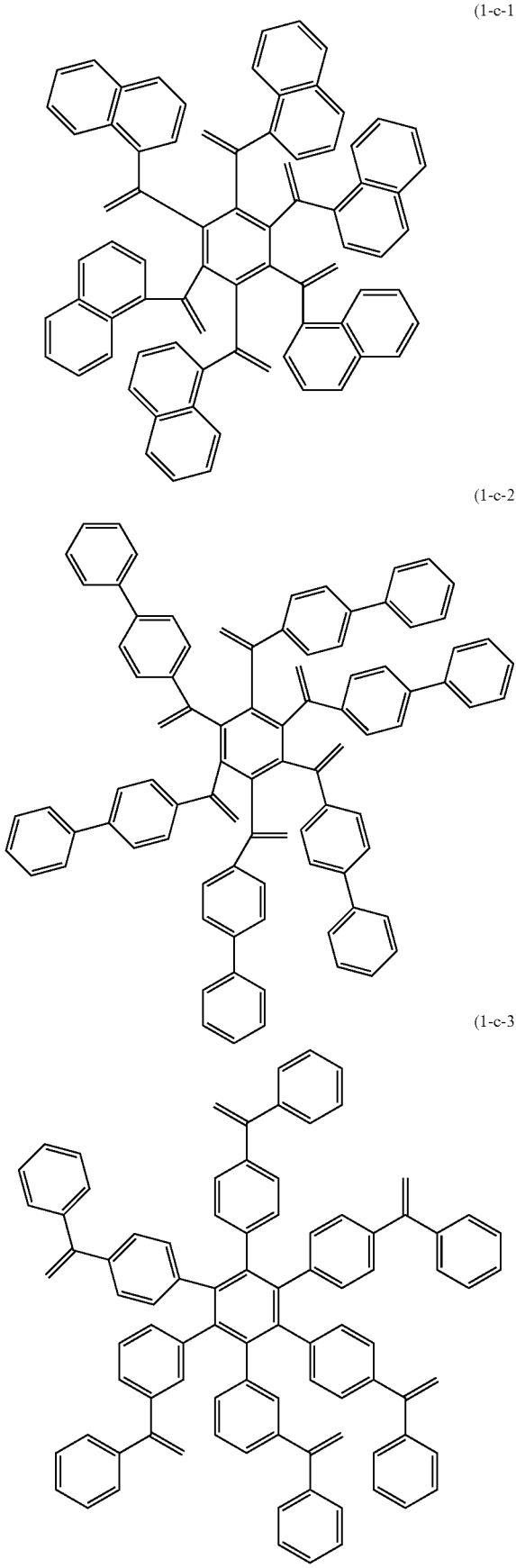

Of these, the compounds (1-a-1) to (1-a-6) are preferred.

For example, in a case where $R^1$ represents a group represented by the above formula (a), $R^A$ and $R^B$ each represent a hydrogen atom, $R^C$ represents an aryl group, and $R^D$ represents a single bond, the compound (A) can be synthesized in accordance with the following reaction scheme.

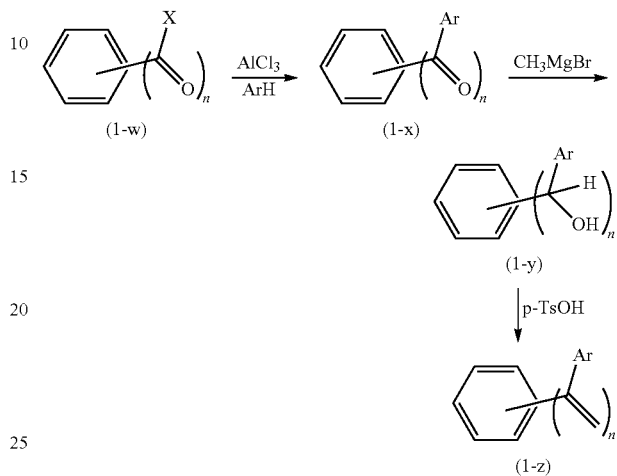

In the above scheme, X represents a halogen atom; Ar represents an aryl group; and n is an integer of 3 to 6.

A compound represented by the above formula (1-x) is obtained by reacting a compound represented by the above formula (1-w) with an aromatic compound represented by ArH in a solvent such as dry dichloromethane in the presence of aluminum chloride or the like.

Next, a compound represented by the above formula (1-y) is obtained by reacting the compound represented by the above formula (1-x) with methylmagnesium bromide or the like in a solvent such as tetrahydrofuran.

Then, a compound represented by the above formula (1-z) can be obtained by reacting the compound represented by the above formula (1-y) in a solvent such as toluene in the presence of an acid catalyst such as p-toluenesulfonic acid. The product thus obtained may be purified by reprecipitation, recrystallization, washing, column chromatography, and/or the like.

The compound (A) other than the compound (1-z) described above can also be synthesized by a similar procedure.

The lower limit of the molecular weight of the compound (A) is preferably 400, more preferably 450, still more preferably 500, and particularly preferably 550 in light of an improvement of the heat resistance of the formed resist underlayer film. The upper limit of the molecular weight of the compound (A) is preferably 5,000, more preferably 4,000, still more preferably 3,000, and particularly preferably 2,000 in light of an improvement of the flatness of the formed resist underlayer film.

The lower limit of the percentage content of carbon atoms of the compound (A) is preferably 50 atom %, more preferably 55 atom %, and still more preferably 60 atom %. Moreover, the lower limit of the percentage content of carbon atoms of the compound (A) is preferably 80% by mass, more preferably 85% by mass, and still more preferably 90% by mass. The higher percentage content of carbon atoms is more preferred.

When the percentage content of carbon atoms of the compound (A) falls within the above range, the heat resistance of the formed resist underlayer film can be further improved.

The content of the compound (A) in the composition for film formation with respect to the total solid content is preferably no less than 80% by mass, more preferably no less than 90% by mass, and still more preferably no less than 95% by mass.

(B) Solvent

The solvent (B) is not particularly limited as long as it can dissolve or disperse therein the compound (A), and the optional component(s) contained as desired.

The solvent (B) is exemplified by an alcohol solvent, an ether solvent, a ketone organic solvent, an amide solvent, an ester organic solvent, a hydrocarbon solvent, and the like.

Examples of the alcohol solvent include monohydric alcohol solvents including a chain or alicyclic hydrocarbon group having 1 to 16 carbon atoms, monohydric alcohol solvents including an aromatic group having 6 to 12 carbon atoms, polyhydric alcohol solvents having 2 to 12 carbon atoms, polyhydric alcohol partially etherified solvents having 3 to 15 carbon atoms, and the like.

Examples of the ether solvent include dialkyl ether solvents having 4 to 12 carbon atoms, cyclic ether solvents having 4 to 8 carbon atoms, aromatic ring-containing ether solvents having 7 to 12 carbon atoms, and the like.

Examples of the ketone solvent include chain ketone solvents having 3 to 12 carbon atoms, cyclic ketone solvents having 5 to 12 carbon atoms, diketone solvents having 5 to 12 carbon atoms, aromatic ring-containing ketone solvents having 7 to 12 carbon atoms, and the like.

Examples of the amide solvent include cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include monocarboxylic acid ester solvents, dicarboxylic acid diester solvents, partially etherified carboxylate solvents of polyhydric alcohols, lactone solvents, carbonate solvents, and the like.

Examples of the hydrocarbon solvent include chain or alicyclic hydrocarbon solvents having 5 to 12 carbon atoms, aromatic hydrocarbon solvents having 6 to 18 carbon atoms, and the like.

Of these, ketone solvents are preferred, cyclic ketone solvents are more preferred, and cyclohexanone is still more preferred. The composition for film formation may contain one, or two or more types of the solvent (B).

(C) Acid Generating Agent

The acid generating agent (C) is a component that generates an acid upon an exposure or heating. When the composition for film formation contains the acid generating agent (C), a crosslinking reaction can be allowed to proceed between the compounds (A) at comparatively low temperatures including normal temperatures.

An acid generating agent that generates an acid upon an exposure (hereinafter, may be also referred to as "photoacid generating agent") is exemplified by those described in paragraphs [0077] to [0081] of the Japanese Unexamined Patent Application, Publication No. 2004-168748.

Moreover, an acid generating agent that generates an acid upon heating (hereinafter, may be also referred to as "thermal acid generating agent") is exemplified by 2,4,4,6-tetrabromocyclohexadienone, benzoin tosylate, 2-nitrobenzyl tosylate, alkylsulfonates, and the like in addition to the onium salt acid generating agents exemplified as the photoacid generating agent described above.

Of these acid generating agents (C), the thermal acid generating agent is preferred, an onium salt-type acid generating agent is more preferred, and an iodonium salt acid generating agent is still more preferred.

The content of the acid generating agent (C) with respect to 100 parts by mass of the compound (A) is preferably no greater than 5,000 parts by mass, more preferably 0.1 parts by mass to 500 parts by mass, still more preferably 0.5 parts by mass to 100 parts by mass, and particularly preferably 1 part by mass to 20 parts by mass. When the content of the acid generating agent (C) falls within the above range, the strength of the resist underlayer film formed from the composition for film formation can be further increased. The acid generating agent (C) may be used either alone, or in combination of two or more types thereof. Moreover, the photoacid generating agent and the thermal acid generating agent may be used in combination as the acid generating agent (C).

(D) Crosslinking Agent

The crosslinking agent (D) is a compound that includes a crosslinkable group (other than those corresponding to the compound (A)). When the composition for film formation contains the crosslinking agent (D), crosslinking between the compounds (A) can be achieved more effectively.

The crosslinking agent (D) preferably includes two crosslinkable groups.

The crosslinking agent (D) is exemplified by a polynuclear phenol, an alkoxymethylated melamine, an alkoxymethylated glycoluril, a diisocyanate, a compound represented by the following formula (d) (hereinafter, may be also referred to as "compound (d)"), and the like.

Ar(—Y-Q)$_n$ (d)

In the above formula (d), Ar represents an aromatic hydrocarbon group having a valency of n or a heteroaromatic group having a valency of n; Y represents a carbonyl group or a sulfonyl group; Q represents a monovalent heteroaromatic group or —OR$^2$; R$^2$ represents a monovalent organic group having 1 to 30 carbon atoms; n is an integer of 2 to 7, wherein a plurality of Ys are identical or different, and a plurality of Qs are identical or different.

It is presumed that when the compound (d) is used as the crosslinking agent (D), the crosslinking agent (D) and the compound (A) are reacted with each other, whereby a carbonyl group or a sulfonyl group surrounded by aromatic rings would be generated. Consequently, the heat resistance of the resist underlayer film formed from the composition for film formation can be further improved, and in addition, the refractive index and the extinction coefficient can be further optimized.

Examples of the aromatic hydrocarbon group having a valency of n which may be represented by Ar include groups obtained by eliminating n hydrogen atoms, which bond to the aromatic ring, from an aromatic hydrocarbon such as benzene, toluene, xylene, naphthalene, anthracene, indene and fluorenylidenebiphenyl, and the like.

Examples the heteroaromatic group having a valency of n which may be represented by Ar include groups obtained by eliminating n hydrogen atoms, which bond to the heteroaromatic cycle, from a heteroaromatic compound such as furan, pyrrole, thiophene, phosphole, pyrazole, oxazole, isoxazole, thiazole, pyridine, pyrazine, pyrimidine, pyridazine and triazine, and the like.

Y is preferably a carbonyl group.

Examples of the monovalent heteroaromatic group which may be represented by Q include groups obtained by adding (n−1) hydrogen atoms to groups exemplified in connection with the heteroaromatic group having a valency of n which may be represented by Ar, and the like.

Examples of the monovalent organic group having 1 to 30 carbon atoms represented by $R^2$ of —$OR^2$ in Q include groups represented by the following formulae (i) to (iii) (hereinafter, may be also referred to as "groups (i) to (iii)"), and the like.

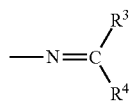
(i)

In the above formula (i), $R^3$ and $R^4$ each independently represent a monovalent organic group having 1 to 20 carbon atoms, or taken together represent a ring structure having 3 to 20 ring atoms together with the carbon atom to which $R^3$ and $R^4$ bond.

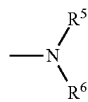
(ii)

In the above formula (ii), $R^5$ and $R^6$ each independently represent a monovalent organic group having 1 to 20 carbon atoms, or taken together represent a ring structure having 3 to 20 ring atoms together with the nitrogen atom to which $R^5$ and $R^6$ bond.

(iii)

In the above formula (iii), $R^7$ represents a monovalent organic group having 1 to 20 carbon atoms that includes an electron-withdrawing group.

Examples of the monovalent organic group having 1 to 20 carbon atoms which may be represented by $R^3$ to $R^6$ include: monovalent hydrocarbon groups having 1 to 20 carbon atoms; hetero atom-containing groups obtained by combining the hydrocarbon group with at least one group selected from the set consisting of —CO—, —COO—, —O—, —NR'—, —CS—, —S—, —SO— and —$SO_2$—; groups obtained by substituting a part or all of hydrogen atoms included in the hydrocarbon group and the hetero atom-containing group with a fluorine atom, a hydroxy group, a carboxy group, a cyano group or the like; and the like, wherein R' represents a hydrogen atom or a monovalent hydrocarbon group having 1 to 20 carbon atoms.

Examples of the monovalent hydrocarbon group having 1 to 20 carbon atoms include:

chain hydrocarbon groups having 1 to 20 carbon atoms including for example, alkyl groups such as a methyl group, an ethyl group and a propyl group; alkenyl groups such as an ethenyl group and a propenyl group; and alkynyl groups such as an ethynyl group and a propynyl group;

alicyclic hydrocarbon groups having 3 to 20 carbon atoms including for example, cycloalkyl groups such as a cyclopropyl group, a cyclobutyl group, a cyclopentyl group and a norbornyl group; and a cyclopropenyl group, a cyclobutenyl group, a cyclopentenyl group and a norbornyl group;

aromatic hydrocarbon group having 6 to 20 carbon atoms including for example, aryl groups such as a phenyl group, a tolyl group, a xylyl group and a naphthyl group; and aralkyl groups such as a benzyl group and a naphthylmethyl group; and the like.

Examples of the ring structure having 3 to 20 ring atoms taken together represented by $R^3$ and $R^4$ together with the carbon atom to which $R^3$ and $R^4$ bond include a cyclopropane structure, a cyclobutane structure, a cyclopentane structure, a cyclohexane structure, and the like.

Examples of the ring structure having 3 to 20 ring atoms taken together represented by $R^5$ and $R^6$ together with the nitrogen atom to which $R^5$ and $R^6$ bond include an azacyclopropane structure, an azacyclobutane structure, an azacyclopentane structure, an azacyclohexane structure, and the like.

Examples of the monovalent organic group having 1 to 20 carbon atoms that includes an electron-withdrawing group which is represented by $R^7$ include monovalent hydrocarbon groups having 1 to 20 carbon atoms derived by substituting a part or all of hydrogen atoms thereof with the electron-withdrawing group, and the like. Examples of the electron-withdrawing group include: halogen atoms such as a fluorine atom and a chlorine atom; a nitro group; a cyano group; and the like. Of these, a fluorine atom, a nitro group and a cyano group are preferred.

Examples of the group (i) include groups represented by the following formulae (i-1) to (i-4); examples of the group (ii) include the groups represented by the formula (ii-1); and examples of the group (iii) include groups represented by the following formulae (iii-1) to (iii-4); and the like.

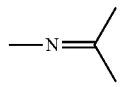
(i-1)

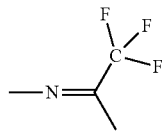
(i-2)

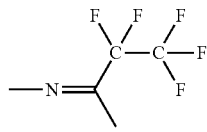
(i-3)

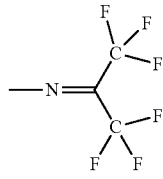
(i-4)

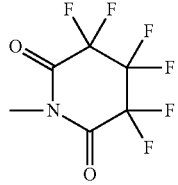
(ii-1)

-continued

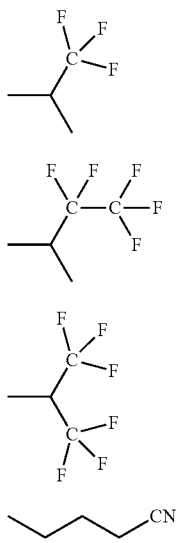

(iii-1)

(iii-2)

(iii-3)

(iii-4)

Of these, the group represented by the above formula (iii-3), and the group represented by the above formula (iii-4) are preferred.

Preferably, n is an integer of 2 to 5, more preferably 2 or 3, and still more preferably 2.

Examples of the polynuclear phenol include: dinuclear phenols such as 4,4'-biphenyldiol, 4,4'-methylenebisphenol, 4,4'-ethylidenebisphenol and bisphenol A; trinuclear phenols such as 4,4',4"-methylidenetrisphenol, 4,4'-(1-(4-(1-(4-hydroxyphenyl)-1-methylethyl)phenyl)ethylidene)bisphenol and 4,4'-(1-(4-(1-(4-hydroxy-3,5-bis(methoxymethyl)phenyl)-1-methylethyl)phenyl)ethylidene)bis(2,6-bis(methoxymethyl)phenol); polyphenols such as novolak; and the like.

Examples of the alkoxymethylated melamine include hexakis(methoxymethyl)melamine, hexakis(n-butoxymethyl)melamine, and the like.

Examples of the alkoxymethylated glycoluril include 1,3,4,6-tetrakis(methoxymethyl)glycoluril, 1,3,4,6-tetrakis(n-butoxymethyl)glycoluril, and the like.

Examples of the diisocyanate include 2,3-tolylene diisocyanate, 2,4-tolylene diisocyanate, 3,4-tolylene diisocyanate, 3,5-tolylene diisocyanate, 4,4'-diphenylmethane diisocyanate, hexamethylene diisocyanate, 1,4-cyclohexane diisocyanate, and the like.

Examples of the compound (d) include compounds represented by the following formulae (d-1) to (d-4), and the like.

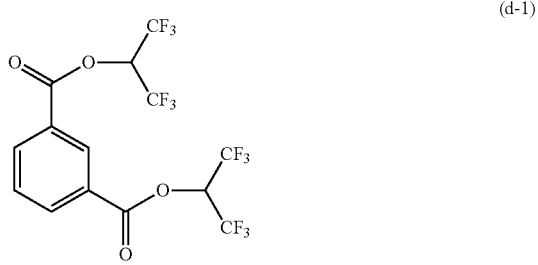

(d-1)

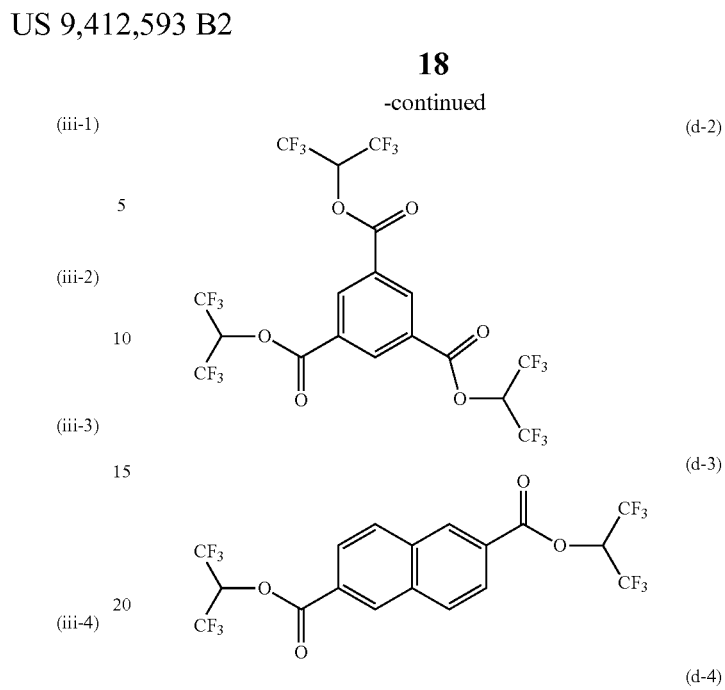

(d-2)

(d-3)

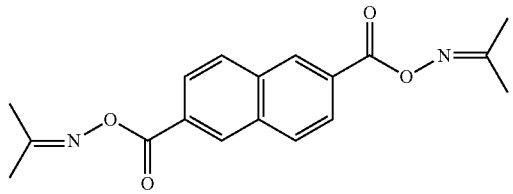

(d-4)

Of these, as the crosslinking agent (D), a polynuclear phenol, an alkoxymethylated glycoluril and the compound (d) are preferred, and 4,4'-(1-(4-(1-(4-hydroxyphenyl)-1-methylethyl)phenyl)ethylidene)bisphenol, 1,3,4,6-tetrakis(methoxymethyl)glycoluril, the compound represented by the above formula (d-1) (1,3-di(1,1,1,3,3,3-hexafluoropropan-2-yloxycarbonyl)benzene) are more preferred. When the composition for film formation employs any of the compounds described above as the crosslinking agent (D), the heat resistance and strength of the resulting resist underlayer film can be further improved.

A commercially available product of the crosslinking agent (D) is exemplified by: "Epicoat" series available from Yuka Shell Epoxy Co., Ltd.; "Araldite" series available from Ciba-Geigy; "DER" series available from Dow Chemical; "Cymel" series and "Mycoat" series available from Mitsui-Cyanamid Ltd.; "Resitop" series available from Gun Ei Chemical Industry Co., Ltd; "Nikalac" series available from Sanwa Chemical Co., Ltd; and the like.

The content of the crosslinking agent (D) with respect to 100 parts by mass of the compound (A) is preferably no greater than 1,000 parts by mass, more preferably 0.1 parts by mass to 500 parts by mass, still more preferably 1 part by mass to 100 parts by mass, and particularly preferably 2 parts by mass to 50 parts by mass. When the content of the crosslinking agent (D) falls within the above range, the heat resistance and strength of the resist underlayer film formed from the composition for film formation can be further improved. The crosslinking agent (D) may be used either alone, or in combination of two or more types thereof.

Other Optional Components

The composition for film formation may contain as other optional component in addition to the components (A) to (D), a binder resin, an accelerator, a surfactant, a radioactive ray absorbing agent, a storage stabilizing agent, a defoaming agent, an adhesion promoter, and the like. The composition for film formation may contain each one, or two or more types of each of the optional components.

Binder Resin

When the composition for film formation contain the binder resin, the formed resist underlayer film can exhibit improved resistance to an organic solvent contained in a composition for forming a resist film, an intermediate layer or the like provided on the upper face of the resist underlayer film.

Although the binder resin is not particularly limited as long as it is contains a polymer compound, the binder resin is preferably at least one selected from the group consisting of a novolak resin, a resol resin, a styrene resin, an acenaphthylene resin, and a polyarylene resin. When any of the resin described above is used as the binder resin, the refractive index and the extinction coefficient of the resist underlayer film can be controlled to attain a more appropriate value. Consequently, the rectangularity of a cross-sectional shape of the formed resist pattern may be improved.

Examples of the novolak resin include resins obtained by reacting an aldehyde or a divinyl compound or the like with one, or two or more types of phenolic compound selected from the group consisting of: a phenol such as phenol, cresol, xylenol, resorcinol, bisphenol A, p-tert-butylphenol or p-octylphenol; and a naphthol such as α-naphthol, β-naphthol, 1,5-dihydroxynaphthalene or 2,7-dihydroxynaphthalene, using, for example, an acidic catalyst, and the like.

Examples of the aldehyde include aldehydes such as formaldehyde; aldehyde sources such as paraformaldehyde and trioxane, and the like.

Examples of the divinyl compound include divinylbenzene, dicyclopentadiene, tetrahydroindene, 4-vinylcyclohexene, 5-vinylnorborn-2-ene, α-pinene, β-pinene, limonene, 5-vinylnorbornadiene, and the like.

Examples of the resol resin include resins obtained by reacting the phenolic compound with the aldehyde using an alkaline catalyst, and the like.

Examples of the styrene resin include polystyrene; styrene copolymers such as styrene-α-methylstyrene copolymers and styrene-butadiene copolymers, and the like.

Examples of the acenaphthylene resin include resins obtained by polymerizing a compound having an acenaphthylene skeleton through radical polymerization, anionic polymerization, cationic polymerization or the like in an appropriate polymerization system such as bulk polymerization, solution polymerization or the like, and the like. In addition, the acenaphthylene resin can be obtained by, for example, reacting a polymer of a compound having an acenaphthylene skeleton with paraformaldehyde under an acidic condition, as described in paragraphs [0008] to[0031] of Japanese Unexamined Patent Application, Publication No. 2002-296789.

Examples of the polyarylene resin include polyarylene ethers, polyarylene sulfides, polyarylene ether sulfones, polyarylene ether ketones, and the like.

The binder resin preferably includes a naphthalene ring. When the binder resin includes a naphthalene skeleton, the refractive index and the extinction coefficient of the resist underlayer film can be controlled to attain a more appropriate value, and consequently, the rectangularity of a cross-sectional shape of the formed resist pattern may be further improved. In addition, the binder resin preferably includes a group having a carbon-carbon triple bond. According to the composition for film formation, when the binder resin includes the above-described group, the etching resistance and the flexural resistance of the formed resist underlayer film may be improved. Examples of the group having a carbon-carbon triple bond include an ethynyl group, a propargyl group, and the like.

The binder resin may include a crosslinkable group. When the binder resin includes the crosslinkable group, the strength of the formed resist underlayer film may be increased due to crosslinking between the binder resins or between the binder resin and the compound (A). On the other hand, when the binder resin does not substantially include the crosslinkable group, film shrinkage that occurs in forming the resist underlayer film can be inhibited, and consequently, the flatness of the formed resist underlayer film may be further improved.

The weight average molecular weight (Mw) of the binder resin is preferably no less than 2,000 and no greater than 8,000, and more preferably no less than 3,000 and no greater than 7,000. When the Mw of the binder resin falls within the above range, the solvent resistance of the resist underlayer film formed from the composition for film formation may be further improved.

The ratio (Mw/Mn) of the weight average molecular weight to the number average molecular weight (Mn) of the binder resin is preferably 1 to 5, more preferably 1 to 3, and still more preferably 1 to 2.5.

The content of the binder resin with respect to 100 parts by mass of the compound (A) is preferably no less than 5 parts by mass and no greater than 1,000 parts by mass, more preferably no less than 10 parts by mass and no greater than 700 parts by mass, and still more preferably no less than 30 parts by mass and no greater than 400 parts by mass. When the content of the binder resin falls within the above range, the solvent resistance of the resist underlayer film formed from the composition for film formation may be further improved.

Accelerator

The accelerator is a one-electron oxidizing agent for sufficiently causing a dehydrogenation reaction required for oxidative crosslinking, or the like. The one-electron oxidizing agent as referred to means an oxidizing agent which itself accepts a one-electron transfer. For example, in the case of cerium (IV) ammonium nitrate, the cerium ion (IV) gains one electron to convert into a cerium ion (III). On the other hand, a radical oxidizing agent such as a halogen gains one electron to convert into an anion. A phenomenon of oxidizing a material to be oxidized (e.g., a substrate, a catalyst, etc., for the oxidation) in this manner by taking away one electron from the material to be oxidized is referred to as one-electron oxidization, and a component that accepts one electron in this process is referred to as a one-electron oxidizing agent.

The one-electron oxidizing agent is exemplified by (a) a metal compound, (b) a peroxide, (c) a diazo compound, (d) halogen or a halogen acid, and the like.

Examples of the metal compound (a) include metal compounds that contain cerium, lead, silver, manganese, osmium, ruthenium, vanadium, thallium, copper, iron, bismuth or nickel. Specifically, (a1) cerium salts (for example, cerium salts having a valency of 4) such as cerium (IV) ammonium nitrate (CAN; ammonium hexanitratocerate (IV)), cerium (IV) acetate, cerium (IV) nitrate and cerium (IV) sulfate; (a2) lead compounds (for example, lead compounds having a valency of 4) such as lead tetraacetate and lead (IV) oxide; (a3) silver compounds such as silver (I) oxide, silver (II) oxide, silver carbonate (Fetizon's reagent) and silver nitrate; (a4) manganese compounds such as permanganate salts, activated manganese dioxide and manganese (III) salts; (a5) osmium compounds such as osmium tetroxide; (a6) ruthenium compounds such as ruthenium tetroxide; (a7) vanadium compounds such as $VOCl_3$, $VOF_3$, $V_2O_5$, $NH_4VO_3$ and $NaVO_3$; (a8) thallium compounds such as thallium (III)

acetate, thallium (III) trifluoroacetate and thallium (III) nitrate; (a9) copper compounds such as copper (II) acetate, copper (II) trifluoromethanesulfonate, copper (II) trifluoroborate, copper (II) chloride and copper (I) acetate; (a10) iron compounds such as iron (III) chloride and potassium hexacyanoferrate (III); (a11) bismuth compounds such as sodium bismuthate; (a12) nickel compounds such as nickel peroxide; and the like.

Examples of the peroxide (b) include: peracids such as peracetic acid and m-chloroperbenzoic acid; hydroxyperoxides such as hydrogen peroxide, and alkyl hydroxyperoxides, e.g., t-butyl hydroperoxide; diacyl peroxides, peracid esters, peracid ketals, peroxydicarbonate salts, dialkyl peroxides, and peracid ketones; and the like.

Examples of the diazo compound (c) include 2,2'-azobisisobutyronitrile, and the like.

Examples of the halogen or halogen acid (d) include: halogens selected from chlorine, bromine and iodine; perhalogen acids, halogen acids, halous acids, hypohalous acids, and salts thereof, and the like. It is to be noted that the halogen in the halogen acid is exemplified by chlorine, bromine and iodine. In addition, specific compounds falling under the category of halogen acid or salts thereof include sodium perchlorate, sodium bromate, and the like.

Of these one-electron oxidizing agents, the peroxide (b) and the diazo compound (c) are preferred, and m-chloroperbenzoic acid, t-butyl hydroperoxide, and 2,2'-azobisisobutyronitrile are more preferred. When these are used, residual metals are less likely to be attached to the substrate.

The content of the accelerator with respect to 100 parts by mass of the compound (A) is preferably no greater than 1000 parts by mass, more preferably 0.01 parts by mass to 500 parts by mass, and still more preferably 0.1 parts by mass to 100 parts by mass.

Surfactant

The surfactant is a component that exhibits the effects of improving the coating property, striation, wettability, developability and the like of the composition for film formation. The content of the surfactant with respect to 100 parts by mass of the compound (A) is preferably no greater than 15 parts by mass, and more preferably no greater than 10 parts by mass. The surfactant may be used either alone, or in combination of two or more types thereof.

Preparation Method of Composition for Film Formation

The composition for film formation may be prepared, for example, by mixing the compound (A) and the solvent (B), as well as the optional component(s) which may be contained as needed, at a predetermined ratio. The composition for film formation is preferably filtered through a filter of about 0.1 μm, for example, after the mixing. The solid content concentration of the composition for film formation is preferably 0.1% by mass to 50% by mass, more preferably 0.5% by mass to 30% by mass, and still more preferably 1% by mass to 20% by mass. The concentration of the compound (A) in the composition for film formation is preferably 0.1% by mass to 30% by mass, more preferably 0.5% by mass to 20% by mass, and still more preferably 1% by mass to 15% by mass.

The viscosity of the composition for film formation having a solid content concentration of 20% by mass is preferably no less than 1 cps and no greater than 5 cps, and more preferably no less than 1 cps and no greater than 3 cps. When the value of the viscosity of the composition for film formation falls within the above range, burying performances thereof may be improved, and the flatness of the resist underlayer film formed may be improved.

Forming Method of Resist Underlayer Film

The forming method of the resist underlayer film according to another embodiment of the present invention includes:

providing a coating film directly or indirectly on a substrate (hereinafter, may be also referred to as "coating film-providing step"); and baking the coating film (hereinafter, may be also referred to as "baking step"), wherein the coating film is provided by using the composition for film formation.

According to the forming method of a resist underlayer film, due to using the composition for film formation described above, a resist underlayer film exhibiting superior heat resistance and superior flatness can be formed. In addition, the forming method of a resist underlayer film can be also suitably applied to a stepped substrate and a substrate having a plurality of types of trenches, and a resist underlayer film superior in flatness can be formed.

Hereinafter, each step is explained.

Coating Film-Providing Step

In this step, a coating film is provided directly or indirectly on a substrate using the composition for film formation.

The substrate is exemplified by a silicon wafer, a wafer covered with aluminum, and the like.

As described above, in the forming method of a resist underlayer film, the stepped substrate, the substrate having a plurality of types of trenches, and the like can be also suitably used, and a resist underlayer film superior in flatness can be formed.

As the substrate having a plurality of types of trenches, a substrate having trenches differing from one another in terms of an aspect ratio can be also suitably used, for example. A substrate that involves various values of the aspect ratio may also be used; for example, the ratio of the maximum value to the minimum value of the aspect ratios of the trenches of the substrate is preferably no less than 3, more preferably no less than 5, still more preferably 10, and particularly preferably no less than 15.

The procedure for applying the composition for film formation to the substrate is not particularly limited, and applying the composition for film formation may be carried out by an appropriate procedure such as, for example, spin coating, cast coating and roll coating.

The film thickness of the coating film formed is preferably 100 nm to 5 μm, and more preferably 200 nm to 3 μm.

Baking Step

In this step, the coating film provided in the coating film-providing step is baked. The procedure for baking the coating film is exemplified by heating. The temperature of the heating is preferably 100° C. to 400° C., more preferably 200° C. to 390° C., and still more preferably 300° C. to 370° C. The time period for the heating is preferably 5 sec to 60 min, more preferably 10 sec to 10 min, and still more preferably 30 sec to 3 min. An atmosphere in the heating is, for example, air, or an inert gas such as a nitrogen gas and an argon gas, and the like.

The film thickness of the resist underlayer film formed is preferably 10 nm to 5 μm, and more preferably 30 nm to 500 μm.

Pattern-Forming Method

The pattern-forming method according to still another embodiment of the present invention includes:

forming a resist pattern on a resist underlayer film formed by the forming method of the resist underlayer film (hereinafter, may be also referred to as "resist pattern-forming step"); and sequentially etching the resist underlayer film and the substrate using the resist pattern as a mask (hereinafter, may be also referred to as "etching step").

In addition, according to the pattern-forming method, it is preferred that:

the resist pattern-forming step includes: providing an intermediate layer directly or indirectly on the resist underlayer film, and forming the resist pattern on the intermediate layer, and.

According to the pattern-forming method, due to the use of the resist underlayer film exhibiting superior heat resistance and superior flatness, which is formed from the composition for film formation described above, a favorable pattern can be formed.

Hereinafter, each step is explained.

Resist Pattern-Forming Step

In this step, a resist pattern is formed on the resist underlayer film. The intermediate layer may be provided directly or indirectly on the resist underlayer film, and the resist pattern may be formed on the intermediate layer.

The intermediate layer has functions exhibited by the resist underlayer film and/or the resist film in the resist pattern formation for the purpose of reinforcing these functions, or has functions not exhibited by the resist underlayer film and/or the resist film in the resist pattern formation for the purpose of imparting functions other than the functions exhibited by the resist underlayer film and/or the resist film. For example, in a case where an antireflective film is provided as the intermediate layer, a reflection-preventive function of the resist underlayer film can be reinforced.

The intermediate layer may be provided by using an organic compound or an inorganic oxide. Examples of the organic compound include materials commercially available from Brewer Science, Inc. under the trade name "DUV-42", "DUV-44", "ARC-28", "ARC-29" and the like, materials commercially available from Rohm & Haas Company under the trade name "AR-3", "AR-19" and the like, etc. Moreover, examples of the inorganic oxide include material commercially available from JSR Corporation under the trade name "NFC SOG" series, and polysiloxane, titanium oxide, oxidized alumina, tungsten oxide, or the like which are formed by a CVD process may be used.

The procedure for providing the intermediate layer is exemplified by, but not particularly limited to, a coating procedure, a CVD process, and the like. Of these, the coating procedure is preferred. In a case where the coating procedure is employed, the intermediate layer can be provided consecutively after forming the resist underlayer film.

Moreover, the film thickness of the intermediate layer is not particularly limited, and may be appropriately selected in accordance with the functions required for the intermediate layer, but the film thickness of the intermediate layer is preferably 10 nm to 3 μm, and more preferably 20 nm to 0.3 μm.

The procedure for forming a resist pattern on the resist underlayer film or the intermediate layer is exemplified by a procedure involving photolithography, and the like. Hereinafter, this procedure is specifically explained.

An exemplary procedure involving photolithography includes:

providing a resist film directly or indirectly on the resist underlayer film using a resist composition (hereinafter, may be also referred to as "resist film-providing step");

exposing the resist film (hereinafter, may be also referred to as "exposure step"); and developing the resist film exposed (hereinafter, may be also referred to as "development step").

Resist Film-Providing Step

In this step, a resist film is provided directly or indirectly on resist underlayer film using a resist composition. Specifically, after the resist composition is applied such that the resulting resist film has a predetermined film thickness, prebaking is executed to evaporate the solvent in the coating film, whereby the resist film is provided.

The resist composition is exemplified by: a positive type or negative type chemically amplified resist composition that contains a photoacid generating agent; a positive type resist composition that contains an alkali-soluble resin and a quinone diazide photosensitizing agent; a negative type resist composition that contains an alkali-soluble resin and a crosslinking agent; and the like.

The solid content concentration of the resist composition is preferably 5% by mass to 50% by mass. In addition, the prepared resist composition is preferably filtered through a filter having a pore size of about 0.2 μm. It is to be noted that in this step, a commercially available resist composition may be directly used.

The procedure for applying the resist composition is not particularly limited, and the resist composition may be applied by an appropriate procedure such as, for example, spin coating, cast coating, roll coating, or the like.

Moreover, the prebaking temperature may be appropriately selected in accordance with the type of the resist composition used and the like, but is preferably 30° C. to 200° C., and more preferably 50° C. to 150° C.

Exposure Step

In this step, the resist film provided in the resist film-providing step is exposed. The exposure is executed through a certain mask pattern, and a liquid immersion liquid, as needed.

The exposure light may be appropriately selected in accordance with the type of the photoacid generating agent used in the resist composition, from e.g., electromagnetic waves such as visible light rays, ultraviolet rays, far ultraviolet rays, X-rays and γ-rays; particle rays such as electron beams, molecular beams, ion beams and α-rays; and the like. Of these, the far ultraviolet rays are preferred; a KrF excimer laser beam (248 nm), an ArF excimer laser beam (193 nm), an $F_2$ excimer laser beam (wavelength: 157 nm), a $Kr_2$ excimer laser beam (wavelength: 147 nm), an ArKr excimer laser beam (wavelength: 134 nm), an extreme ultraviolet ray (wavelength: 13 nm, etc.) are more preferred; and an ArF excimer laser beam is still more preferred.

In order to improve the resolution, the pattern profile, the developability, etc. of the formed resist pattern, post-baking may be executed after the exposure. The temperature of the post-baking may be appropriately adjusted in accordance with the type of the resist composition used and the like, but is preferably 50° C. to 200° C., and more preferably 70° C. to 150° C.

Development Step

In this step, the resist film exposed in the exposure step is developed.

The developer solution which may be used in the development may be appropriately selected in accordance with the type of the resist composition used. For a development with an alkali, specific examples of the developer solution include: aqueous alkaline solutions of sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene, or the like; and the like. It is to be noted that in a case where the intermediate layer-providing step is executed to provide the intermediate layer, the influence of these aqueous alkaline solutions on the resist underlayer film can be minimized.

An appropriate amount of water soluble organic solvent, for example, an alcohol such as methanol and ethanol, and/or a surfactant may be added to these aqueous alkaline solutions.

Moreover, an organic solvent-containing developer solution may be used as the developer solution. Examples of the organic solvent include esters, ketones, ethers, alcohols, amides, hydrocarbons, and the like. The development with an organic solvent has a minor influence on the resist underlayer film.

After the development with the developer solution, washing and drying are executed, whereby a predetermined resist pattern is formed.

Moreover, a procedure involving nanoimprinting, a procedure involving the use of a directed self-assembling composition, and the like may be also employed as the procedure for executing the resist pattern-forming step in place of the procedure involving photolithography described above.

Etching Step

In this step, the resist underlayer film and the substrate are sequentially etched using the resist pattern as a mask. Accordingly, a pattern is formed on the substrate. It is to be noted that in a case where the intermediate layer is provided, the intermediate layer is also dry etched.

The procedure for the etching may be either dry etching or wet etching.

The dry etching may be executed using a well-known dry etching apparatus. In addition, depending on the elemental composition of a substance to be etched, the following gases may be used as a source gas in the dry etching: oxygen atom-containing gases such as $O_2$, CO and $CO_2$; inert gases such as He, $N_2$ and Ar; chlorine-based gases such as $Cl_2$ and $BCl_3$; fluorine-based gases such as $CHF_3$ and $CF_4$; and other gas such as $H_2$ and $NH_3$. It is to be noted that these gases may also be used in mixture.

EXAMPLES

Hereinafter, the embodiments of the present invention will be explained in more detail by way of Examples, but the present invention is not in any way limited to these Examples.

It is to be noted that the polystyrene equivalent weight average molecular weight (Mw) of the compound was determined by gel permeation chromatography using GPC columns ("G2000HXL" ×2, and "G3000HXL" ×1, available from Tosoh Corporation), a differential refractometer as a detector, and mono-dispersed polystyrene as a standard under an analytical condition involving a flow rate of 1.0 mL/min, an elution solvent of tetrahydrofuran, and a column temperature of 40° C. Moreover, each film thickness was measured using a spectroscopic ellipsometer ("M2000D" available from J. A. WOOLLAM).

Synthesis of Compound (A)

Synthesis Example 1

Synthesis of Compound (A-1)

As shown in the following reaction scheme, 19.7 g (148 mmol) of aluminum chloride and 150 mL of dry dichloromethane were added into a 300 mL three-neck flask, and the mixture was stirred at room temperature for 1 hr to allow for suspension. After the mixture was cooled to 0° C. on an ice water bath, a solution prepared by dissolving 9.82 g (37.0 mmol) of 1,3,5-benzenetricarbonyl trichloride in 30 mL of dry dichloromethane was slowly added dropwise. After completing the dropwise addition, the mixture was stirred at 0° C. for 10 min, and thereto was slowly added dropwise a solution prepared by dissolving 15.6 g (122 mmol) of naphthalene in 70 mL of dry dichloromethane. The mixture was stirred for 20 hrs while the temperature was slowly elevated from 0° C. to room temperature. After the reaction liquid was slowly poured into ice water to terminate the reaction, sodium bicarbonate was added to adjust the pH to 7. Dichloromethane was added, and insoluble matter was removed by filtration through Celite. Then, washing with water and drying over anhydrous sodium sulfate were carried out. The solvent was distilled away to give 11.9 g of a compound represented by the following formula (A-x). This compound was used in the subsequent reaction without further purification.

Into a 100 mL three-neck flask was charged 36.7 mL of a 1.0 M solution of methylmagnesium bromide in tetrahydrofuran. Thereto was slowly added dropwise a solution prepared by dissolving 5.50 g (10.2 mmol) of the compound (A-x) obtained above in 35 mL of dry tetrahydrofuran. After completing the dropwise addition, the mixture was heated at 60° C. for 12 hrs with stirring. A small amount of water was added to terminate the reaction, and then the solvent was replaced with ethyl acetate. Washing with water, drying over anhydrous sodium sulfate, and distillation of the solvent away gave 5.75 g of a compound represented by the following formula (A-y). This compound was used in the subsequent reaction without further purification.

Into a 100 mL flask were charged 3.00 g (5.10 mmol) of the compound (A-y) obtained above, 0.10 g of p-toluenesulfonic acid monohydrate, and 80 mL of toluene, and the mixture was heated at 130° C. for 10 hrs with stirring. After cooling to room temperature, the mixture was washed with an aqueous sodium bicarbonate solution, and dried over anhydrous sodium sulfate. After distillation of the solvent away, simple purification was carried out using a short column. The brown solid thus obtained was dissolved in a small amount of dichloromethane, and reprecipitated using methanol to obtain 2.20 g of a compound represented by the following formula (A-1) (yield: 81%).

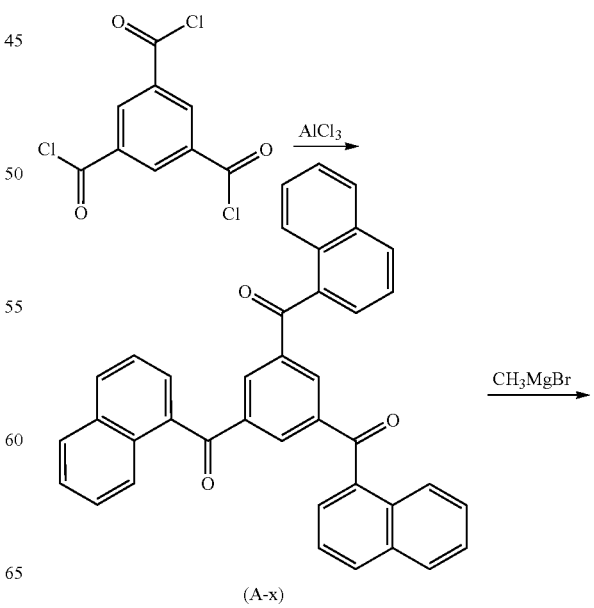

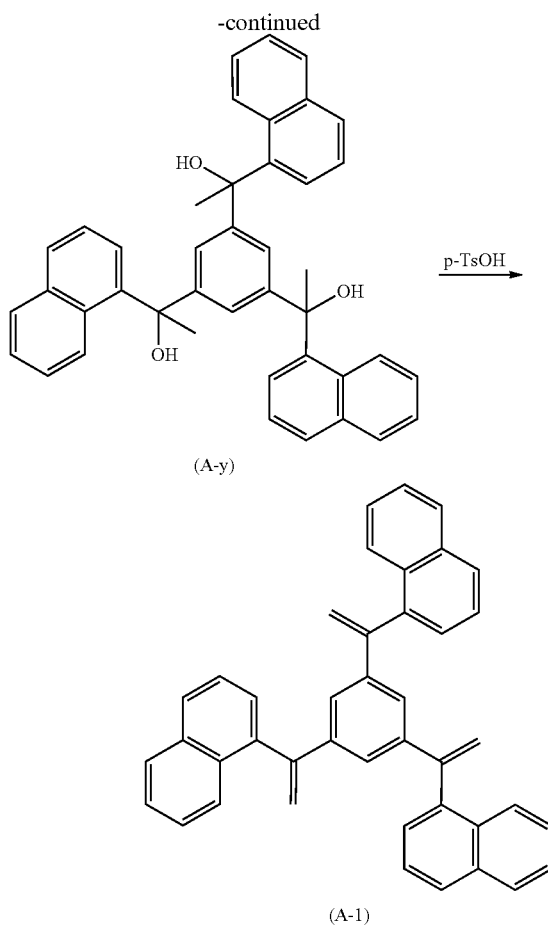

(A-y)

(A-1)

Synthesis Example 2

Synthesis of Compound (A-2)

A compound represented by the following formula (A-2) was obtained in a similar manner to Synthesis Example 1 except that biphenyl was used in place of naphthalene.

Synthesis Example 3

Synthesis of Compound (A-3)

A compound (A-3) was synthesized in accordance with the following reaction scheme.

Into a 300 mL three-neck flask were added 19.7 g (148 mmol) of aluminum chloride and 80 mL of dry dichloromethane, and the mixture was stirred at room temperature for 1 hr to permit suspension. After the mixture was cooled to 0° C. on an ice water bath, a solution prepared by dissolving 19.8 g (141 mmol) of benzoyl chloride in 100 mL of dry dichloromethane was slowly added dropwise. After completing the dropwise addition, the mixture was stirred at 0° C. for 10 min, and thereto was slowly added dropwise a solution prepared by dissolving 11.3 g (37 mmol) of 1,3,5-triphenylbenzene in 100 mL of dry dichloromethane. The mixture was stirred for 20 hrs while the temperature was slowly elevated from 0° C. to room temperature. After the reaction liquid was slowly poured into ice water to terminate the reaction, sodium bicarbonate was added to adjust the pH to 7. Dichloromethane was added, and insoluble matter was removed by filtration through Celite. Then, washing with water and drying over anhydrous sodium sulfate were carried out. The solvent was distilled away to give 15.8 g of a compound represented by the following formula (A-V). This compound was used in the subsequent reaction without further purification.

Next, into a 100 mL three-neck flask was charged 36.7 mL of a 1.0 M solution of methylmagnesium bromide in tetrahydrofuran. Thereto was slowly added dropwise a solution prepared by dissolving 6.31 g (10.2 mmol) of the compound (A-V) obtained above in 50 mL of dry tetrahydrofuran. After completing the dropwise addition, the mixture was heated at 60° C. for 12 hrs with stirring. A small amount of water was added to terminate the reaction, and then the solvent was replaced with ethyl acetate. Washing with water, drying over anhydrous sodium sulfate, and distillation of the solvent away gave 5.58 g of a compound represented by the following formula (A-W). This compound was used in the subsequent reaction without further purification.

Next, into a 100 mL flask were charged 3.40 g (5.10 mmol) of the compound (A-W) obtained above, 0.10 g of p-toluenesulfonic acid monohydrate, and 80 mL of toluene, and the mixture was heated at 130° C. for 10 hrs with stirring. After cooling to room temperature, the mixture was washed with an aqueous sodium bicarbonate solution, and dried over anhydrous sodium sulfate. After distillation of the solvent, simple purification was carried out using a short column. The brown solid thus obtained was dissolved in a small amount of dichloromethane, and reprecipitated using methanol to obtain 2.47 g of a compound represented by the following formula (A-3) (yield: 79%).

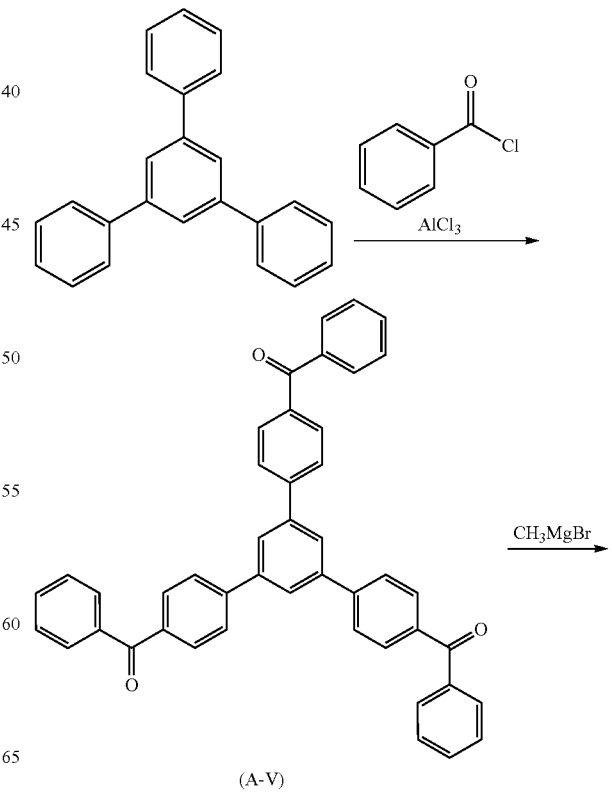

(A-V)

-continued

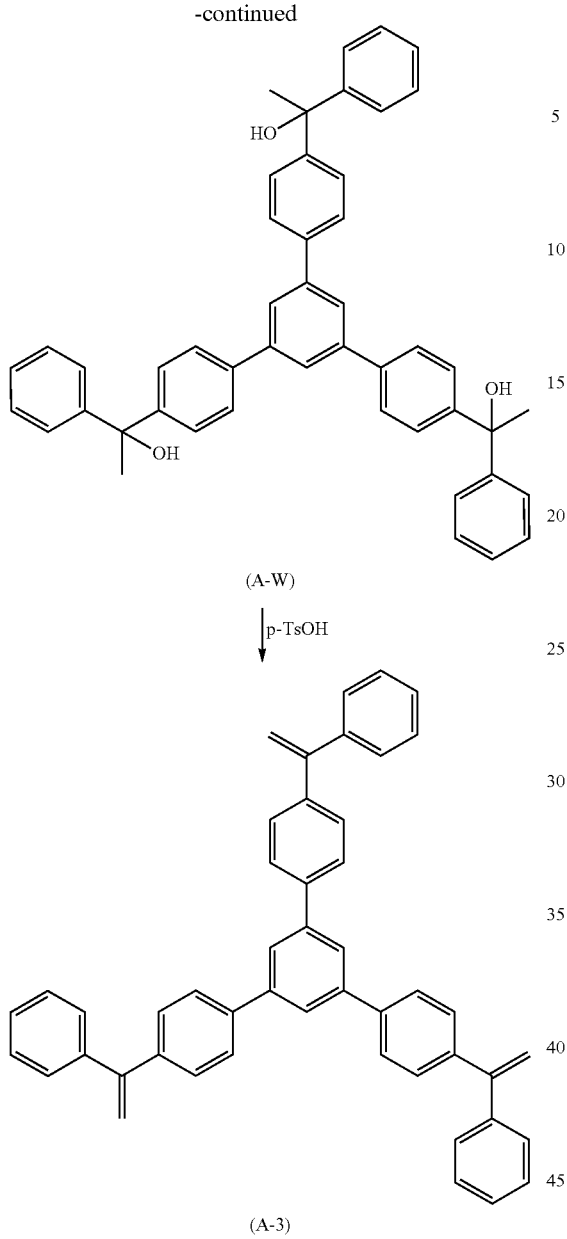

(A-W)

↓ p-TsOH (A-3)

Synthesis Example 4

Synthesis of Compound (A-4)

A compound represented by the following formula (A-4) was obtained in a similar manner to Synthesis Example 3 except that 1,3,5-tribiphenylbenzene was used in place of 1,3,5-triphenylbenzene, and acetyl chloride was used in place of benzoyl chloride.

Synthesis Example 5

Synthesis of Compound (A-5)

A compound represented by the following formula (A-5) was obtained in a similar manner to Synthesis Example 3 except that 1-naphthoyl chloride was used in place of benzoyl chloride.

Synthesis Example 6

Synthesis of Compound (A-6)

A compound represented by the following formula (A-6) was obtained in a similar manner to Synthesis Example 3 except that 1,3,5-tri(1-naphthyl)benzene was used in place of 1,3,5-triphenylbenzene, and acetyl chloride was used in place of benzoyl chloride.

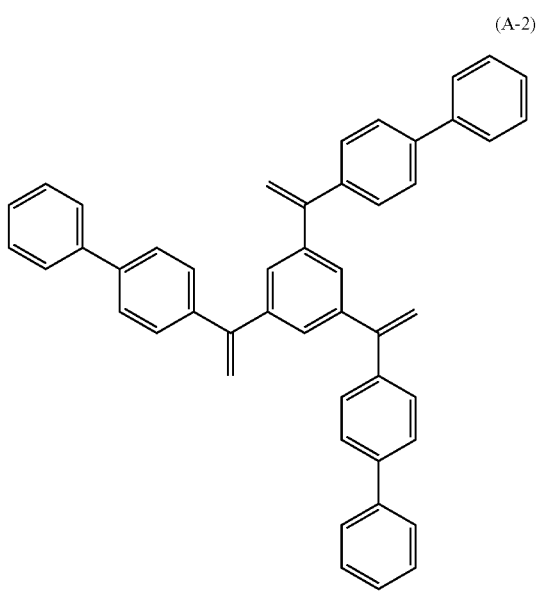

(A-2)

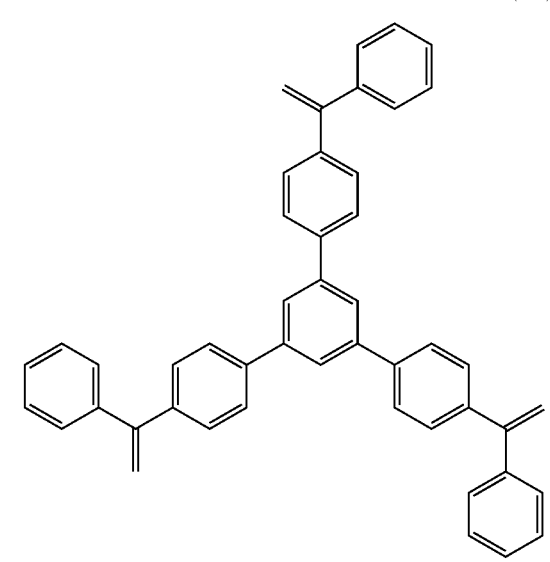

(A-3)

(A-4)

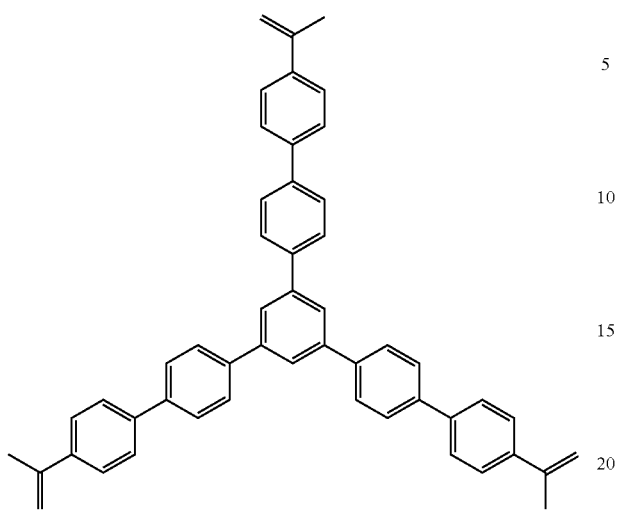

(A-6)

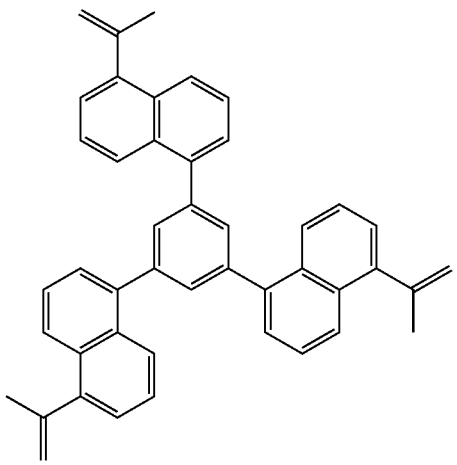

Comparative Synthesis Example 1

Synthesis of Compound (a-1)

Into a separable flask equipped with a thermometer were charged 100 parts by mass of 2,7-dihydroxynaphthalene, 30 parts by mass of formalin, 1 part by mass of p-toluenesulfonic acid, and 150 parts by mass of propylene glycol monomethyl ether under a nitrogen atmosphere, and the polymerization was allowed to proceed at 80° C. for 6 hrs with stirring to obtain a reaction liquid. The obtained reaction liquid was diluted with 100 parts by mass of n-butyl acetate, and the organic layer was washed with a large amount of a mixed solvent of water and methanol (mass ratio: water/methanol=1/2). The solvent was distilled off from the obtained organic layer to obtain a compound (a-1), which was a polymer having a structural unit represented by the following formula (a-1). This compound (a-1) had an Mw of 1,800.

(a-1)

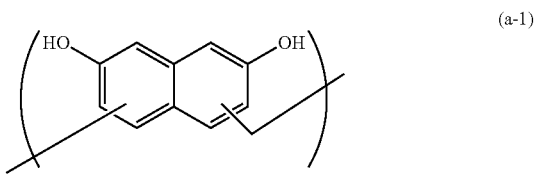

(A-5)

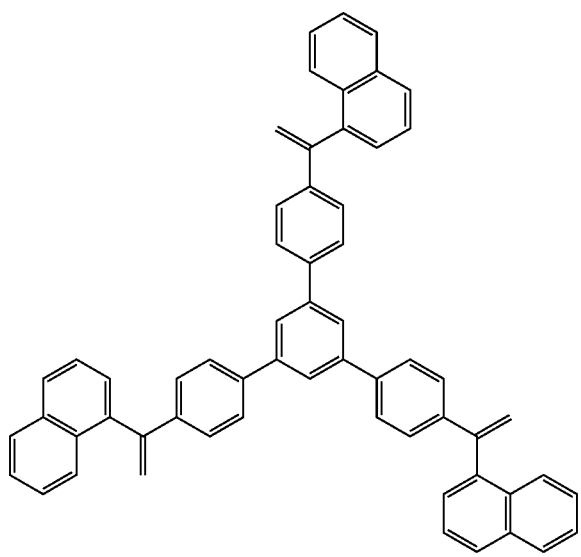

Preparation of Composition for Film Formation

Components constituting the composition for film formation other than the compound (A) are shown below.

(B) Solvent

B-1: cyclohexanone (C) Acid Generating Agent

C-1: bis(t-butylphenyl)iodonium nonafluoro-n-butanesulfonate (a compound represented by the following formula (C-1))

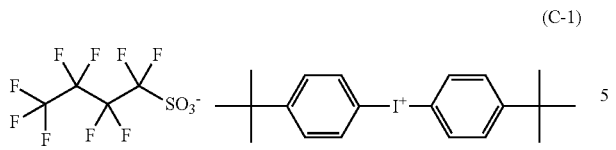

(C-1)

(D) Crosslinking Agent

D-1: "Nikalac N-2702" (a compound represented by the following formula (D-1)) available from Sanwa Chemical Co., Ltd.

D-2: 4,4'-(1-(4-(1-(4-hydroxy-3,5-bis(methoxymethyl)phenyl)-1-methylethyl)phenyl)ethylidene)bis(2,6-bis(methoxymethyl)phenol (a compound represented by the following formula (D-2))

D-3: 1,3-di(1,1,1,3,3,3-hexafluoropropan-2-yloxycarbonyl)benzene (a compound represented by the following formula (D-3))

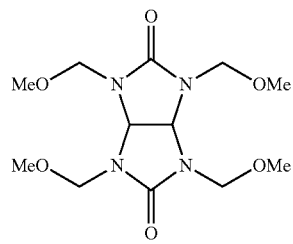

(D-1)

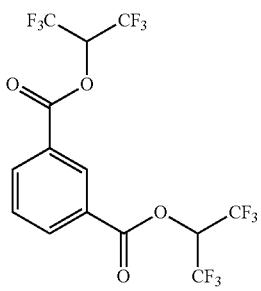

(D-3)

Example 1

A solution was obtained by mixing 10 parts by mass of (A-1) as the compound (A) and 100 parts by mass of (B-1) as the solvent (B). This solution was filtered through a membrane filter having a pore size of 0.1 μm to prepare a composition for film formation (J-1).

Examples 2 to 9 and Comparative Example 1

Compositions for film formation (J-2) to (J-9) and (CJ-1) were prepared in a similar manner to Example 1 except that the type and the content of each component used were as shown in Table 1. It is to be noted that "-" in Table 1 indicates that the corresponding component was not used.

TABLE 1

| | Composition for film formation | (A) Component type | content (parts by mass) | (B) Solvent type | content (parts by mass) | (C) Acid generating agent type | content (parts by mass) | (D) Crosslinking agent type | content (parts by mass) |
|---|---|---|---|---|---|---|---|---|---|
| Example 1 | J-1 | A-1 | 10 | B-1 | 100 | — | — | — | — |
| Example 2 | J-2 | A-2 | 10 | B-1 | 100 | — | — | — | — |
| Example 3 | J-3 | A-3 | 10 | B-1 | 100 | — | — | — | — |
| Example 4 | J-4 | A-4 | 10 | B-1 | 100 | — | — | — | — |
| Example 5 | J-5 | A-5 | 10 | B-1 | 100 | — | — | — | — |
| Example 6 | J-6 | A-6 | 10 | B-1 | 100 | — | — | — | — |
| Example 7 | J-7 | A-1 | 10 | B-1 | 100 | C-1 | 0.5 | D-1 | 1 |
| Example 8 | J-8 | A-1 | 10 | B-1 | 100 | C-1 | 0.5 | D-2 | 1 |
| Example 9 | J-9 | A-1 | 10 | B-1 | 100 | C-1 | 0.5 | D-3 | 1 |
| Comparative Example 1 | CJ-1 | a-1 | 10 | B-1 | 100 | — | — | — | — |

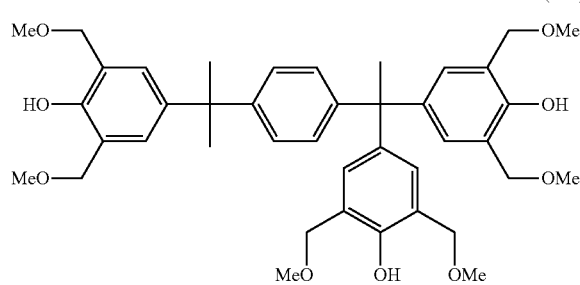

(D-2)

Evaluations

The compositions for film formation obtained above or resist underlayer film-carrying substrates obtained therefrom were evaluated on the following items in accordance with the following methods.

Refractive Index and Extinction Coefficient

Each composition for film formation prepared above was spin-coated on the surface of a silicon wafer having a diameter of 8 inches which was a substrate to provide a coating film, and then the coating film was baked in air at 350° C. for 2 min to form a resist underlayer film having a film thickness of 250 nm. The refractive index and the extinction coefficient at a wavelength of 193 nm of the resist underlayer film formed were determined using a spectroscopic ellipsometer ("M2000D" available from J. A. WOOLLAM). In regard to the determination, in a case where the refractive index was no less than 1.3 and no greater than 1.6, and the extinction coefficient was no less than 0.2 and no greater than 0.8, the composition for film formation was evaluated to be "favorable".

Etching Resistance

First, the composition for film formation was spin-coated on a silicon wafer having a diameter of 8 inches by a spin coating procedure to provide an underlayer film having a film thickness of 300 nm. Thereafter, the underlayer film was subjected to an etching treatment (pressure: 0.03 Torr, high frequency power: 3,000 W; Ar/CF$_4$=40/100 sccm; and substrate temperature: 20° C.), and the film thickness of the underlayer film after the etching treatment was measured. Then, an etching rate (nm/min) was calculated from the relationship between the decrement of the film thickness and the treatment time period, and the proportion of the etching rate with respect to that of Comparative Example was calculated. The smaller value of the proportion indicates more favorable etching resistance.

Heat Resistance

Each composition for film formation was spin-coated on a silicon wafer having a diameter of 8 inches to provide a coating film (resist underlayer film), and the film thickness of the coating film was measured using the spectroscopic ellipsometer (the value of the film thickness acquired in this measurement was designated as X). Next, the resist underlayer film was heated at 350° C. for 120 sec, and the film thickness of the resist underlayer film after the heating was measured using the spectroscopic ellipsometer (the value of the film thickness acquired in this measurement was designated as Y). Then, a percent decrease ΔFT (%) (ΔFT (%)=100×(X−Y)/X) of the film thickness of the resist underlayer film after the heating with respect to the film thickness of the resist underlayer film before the heating was calculated, and the calculated value was defined as heat resistance (%). It is to be noted that the smaller heat resistance (%) suggests that there are less sublimated matter and film degradation products generated in the heating of the resist underlayer film, indicating that the resist underlayer film is more favorable.

Flatness

Each of the compositions for film formation of Examples and Comparative Example described above was applied on a stepped SiO$_2$ substrate on which: trenches having a width of 42 nm, a pitch of 84 nm and a depth of 180 nm (aspect ratio: 4.3); trenches having a width of 100 nm, a pitch of 150 nm and a depth of 180 nm (aspect ratio: 1.8); and trenches having a width of 5 μm and a depth of 180 nm (open spaces; aspect ratio: 0.036) were provided in combination (the ratio of the maximum value to the minimum value of the aspect ratios differing from each other: 119). Thereafter, baking was carried out at 250° C. for 60 sec under an ambient air atmosphere to form a resist underlayer film having a film thickness of 200 nm. The shape of the resist underlayer film was observed using a scanning electron microscope ("S-4800" available from Hitachi High-Technologies Corporation), and the difference between the maximum value and the minimum value of the film thickness of the resist underlayer film on the Trench or spaces (ΔFT) was determined. The flatness was evaluated to be "A" (favorable) in a case where the ΔFT was less than 20 nm, and to be "B" ("unfavorable") in a case where the ΔFT was no less than 20 nm.

The results of the evaluations of the compositions for film formation of Examples 1 to 9 and Comparative Example 1 are shown in Table 2.

TABLE 2

| | Composition for film formation | Refractive index | Extinction coefficient | Etching resistance | Heat resistance (%) | Flatness |
|---|---|---|---|---|---|---|
| Example 1 | J-1 | 1.47 | 0.54 | 0.72 | 10 | A |
| Example 2 | J-2 | 1.43 | 0.59 | 0.76 | 10 | A |
| Example 3 | J-3 | 1.42 | 0.58 | 0.75 | 9 | A |
| Example 4 | J-4 | 1.42 | 0.57 | 0.79 | 11 | A |
| Example 5 | J-5 | 1.48 | 0.54 | 0.75 | 10 | A |
| Example 6 | J-6 | 1.47 | 0.54 | 0.74 | 10 | A |
| Example 7 | J-7 | 1.48 | 0.54 | 0.76 | 9 | A |
| Example 8 | J-8 | 1.47 | 0.54 | 0.72 | 9 | A |
| Example 9 | J-9 | 1.47 | 0.54 | 0.72 | 10 | A |
| Comparative Example 1 | CJ-1 | 1.40 | 0.40 | 1.00 | 20 | B |

As is seen from the results shown in Table 2, the resist underlayer films formed from the compositions for film formation of Examples satisfy the requirements for general characteristics on the refractive index, the extinction coefficient and the etching resistance, and exhibit superior heat resistance and flatness as compared with the resist underlayer films formed from the composition for film formation of Comparative Example.

According to the composition for film formation and the forming method of a resist underlayer film of the embodiments of the present invention, formation of a resist underlayer film is enabled that satisfies requirements for general characteristics such as optical characteristics and etching resistance, and that exhibits superior heat resistance and superior flatness. According to the pattern-forming method of the embodiment of the present invention, a favorable pattern can be formed since the resist underlayer film having superior heat resistance and superior flatness is used. Therefore, these embodiments may be suitably used in pattern formation that employ a multilayer resist process in manufacture of semiconductor devices in which microfabrication of patterns has been further in progress.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method comprising:
   applying a composition directly or indirectly on a substrate to form a coating film;
   baking the coating film such that a resist underlayer film is formed;
   forming a resist pattern on the resist underlayer film; and
   sequentially etching the resist underlayer film and the substrate using the resist pattern as a mask,
   wherein the composition comprises: a compound represented by formula (1); and a solvent,

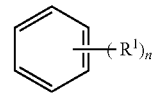

(1)

wherein in the formula (1), R$^1$ represents a monovalent group comprising an aromatic ring; n is an integer of 3 to 6; at least one monovalent group represented by R$^1$ further comprises a group comprising an ethylenic double bond; a plurality of R$^1$s are identical or different;

and a part or all of hydrogen atoms on the benzene ring in the formula (1) and on the aromatic ring are unsubstituted or substituted with a halogen atom or an alkyl group having 1 to 10 carbon atoms.

2. The pattern-forming method according to claim 1, wherein
the forming of the resist pattern comprises: providing an intermediate layer directly or indirectly on the resist underlayer film; and forming the resist pattern on the intermediate layer, and
the sequentially etching comprises etching the intermediate layer.

3. The pattern-forming method according to claim 1, wherein a molecular weight of the compound is no less than 400 and no greater than 5,000.

4. The pattern-forming method according to claim 1, wherein $R^1$ in the formula (1) is represented by formula (a):

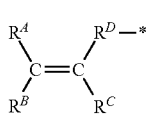
(a)

wherein in the formula (a), $R^A$, $R^B$ and $R^C$ each independently represent a hydrogen atom, a monovalent chain hydrocarbon group having 1 to 10 carbon atoms or a monovalent aromatic hydrocarbon group having 6 to 30 carbon atoms; $R^D$ represents a single bond or a divalent aromatic hydrocarbon group having 6 to 30 carbon atoms; at least one of $R^A$ to $R^D$ comprises the aromatic ring; a part or all of hydrogen atoms on the aromatic ring are unsubstituted or substituted with a halogen atom or an alkyl group having 1 to 10 carbon atoms; and * denotes a biding site with respect to a carbon atom of the benzene ring in the formula (1).

5. The pattern-forming method according to claim 1, wherein the compound is represented by formula (1-1) or (1-2):

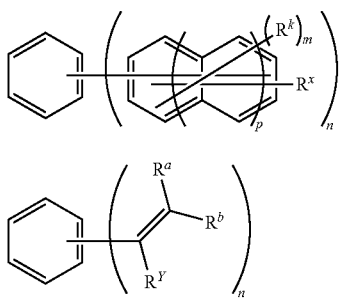

wherein,
in the formulae (1-1) and (1-2), n is an integer of 3 to 6, and a part or all of hydrogen atoms on benzene ring in the formulae (1-1) and (1-2) are unsubstituted or substituted with a halogen atom or an alkyl group having 1 to 10 carbon atoms,
in the formula (1-1), $R^X$ represents a monovalent group comprising the group comprising an ethylenic double bond; $R^k$ represents a halogen atom or an alkyl group having 1 to 10 carbon atoms; and p is an integer of 0 to 2, wherein a plurality of $R^X$s are identical or different, and a plurality of "p"s are identical or different; and m is an integer of 0 to 8, wherein in a case where $R^k$ is present in a plurality of number, a plurality of $R^k$s are identical or different, and
in the formula (1-2), $R^Y$ represents the monovalent group comprising an aromatic ring; and $R^a$ and $R^b$ each independently represent a hydrogen atom or a monovalent chain hydrocarbon group having 1 to 10 carbon atoms, wherein a plurality of $R^Y$s are identical or different, a plurality of $R^a$s are identical or different, and a plurality of $R^b$s are identical or different.

6. The pattern-forming method according to claim 1, wherein the composition further comprises a crosslinking agent.

7. The pattern-forming method according to claim 6, wherein an amount of the crosslinking agent with respect to 100 parts by mass of the compound is from 2 parts by mass to 50 parts by mass.

8. The pattern-forming method according to claim 1, wherein a content of carbon atoms of the compound is no less than 50 atom %.

9. The pattern-forming method according to claim 1, wherein the compound is represented by formula (1-a), formula (1-b), or formula (1-c):

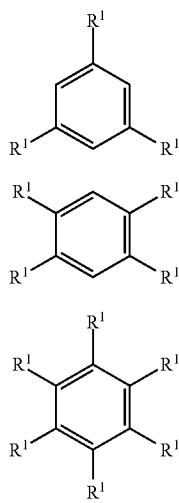

wherein each $R^1$ is identical and as defined in the formula (1).

10. The pattern-forming method according to claim 1, wherein the composition further comprises an acid generating agent.

11. The pattern-forming method according to claim 10, wherein an amount of the acid generating agent with respect to 100 parts by mass of the compound is from 1 part by mass to 20 parts by mass.

12. The pattern-forming method according to claim 1, wherein the composition further comprises a binder resin.

13. The pattern-forming method according to claim 12, wherein the binder resin comprises a naphthalene skeleton.

14. The pattern-forming method according to claim 12, wherein the binder resin comprises a carbon-carbon triple bond.

15. The pattern-forming method according to claim 12, wherein the binder resin comprises a crosslinkable group.

16. The pattern-forming method according to claim 12, wherein a weight average molecular weight of the binder resin is no less than 2,000 and no greater than 8,000.

17. The pattern-forming method according to claim 12, wherein an amount of the binder resin with respect to 100 parts by mass of the compound is no less than 30 parts by mass and no greater than 400 parts by mass.

* * * * *